(12) United States Patent
Fujiwara et al.

(10) Patent No.: US 9,166,612 B2
(45) Date of Patent: Oct. 20, 2015

(54) SEMICONDUCTOR DEVICE

(71) Applicant: Renesas Electronics Corporation, Kawasaki-shi, Kanagawa (JP)

(72) Inventors: Masaki Fujiwara, Kanagawa (JP); Yasuo Morimoto, Kanagawa (JP); Takashi Matsumoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/336,073

(22) Filed: Jul. 21, 2014

(65) Prior Publication Data

US 2015/0042500 A1    Feb. 12, 2015

(30) Foreign Application Priority Data

Aug. 7, 2013   (JP) ................. 2013-164053

(51) Int. Cl.
  *H03M 1/38*   (2006.01)
  *H03M 1/12*   (2006.01)
  *H03M 1/46*   (2006.01)
  *H03K 5/13*   (2014.01)
  *H03K 5/00*   (2006.01)

(52) U.S. Cl.
  CPC ............... *H03M 1/125* (2013.01); *H03M 1/38* (2013.01); *H03M 1/46* (2013.01); *H03K 5/133* (2013.01); *H03K 2005/00065* (2013.01); *H03M 1/468* (2013.01)

(58) Field of Classification Search
  CPC ......... H03M 1/38; H03M 1/46; H03M 1/125; H03M 1/468; H03K 5/133
  USPC ....................................................... 341/161
  See application file for complete search history.

(56) References Cited

U.S. PATENT DOCUMENTS

| | | | |
|---|---|---|---|
| 8,134,487 B2 * | 3/2012 | Harpe ........................... | 341/163 |
| 8,193,957 B2 | 6/2012 | Yoshioka | |
| 8,508,399 B2 * | 8/2013 | Lee et al. ...................... | 341/163 |
| 8,669,896 B2 * | 3/2014 | Tsai et al. ..................... | 341/161 |
| 8,669,897 B1 * | 3/2014 | Chen et al. .................... | 341/161 |
| 8,922,415 B2 * | 12/2014 | Fogleman et al. ............. | 341/163 |

FOREIGN PATENT DOCUMENTS

JP         2011-61597 A    3/2011

* cited by examiner

*Primary Examiner* — Brian Young
(74) *Attorney, Agent, or Firm* — Sughrue Mion, PLLC

(57) ABSTRACT

To provide a semiconductor device capable of accurately controlling the cycle of an internal clock signal. This semiconductor device, by using signal that is output from a sequence register of an asynchronous successive approximation type ADC when N times of comparison are completed, detects whether or not the signal and its delay signal are output when the period transitions from a comparison period to a sampling period, and generates, on the basis of the detection result, a delay control signal for controlling the cycle of an internal clock signal by controlling the delay times of the delay circuits.

20 Claims, 26 Drawing Sheets

| F1 | F2 | DCNTN |
|---|---|---|
| 0 | 0 | DCNT+1<br>(DELAY TIME: REDUCE) |
| 0 | 1 | — |
| 1 | 0 | DCNT<br>(MAINTAIN CURRENT STATE) |
| 1 | 1 | DCNT−1<br>(DELAY TIME: EXTEND) |

$Ta = T(CLKIN) - T(F1)$

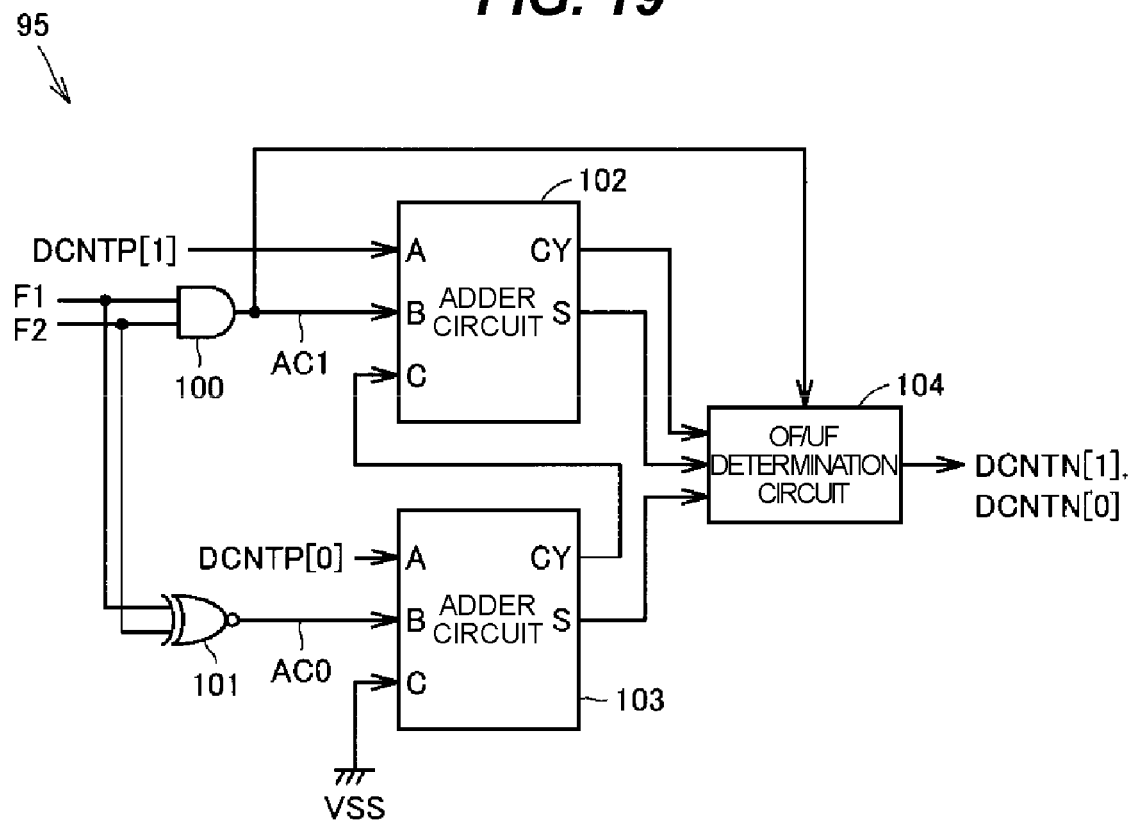

FIG. 22

| F1 | F2 | F3 | F4 | DELAY TIME |
|----|----|----|----|------------|
| 0 | 0 | 0 | 0 | REDUCE |
| 1 | 0 | 0 | 0 | MAINTAIN CURRENT STATE |
| 1 | 1 | 0 | 0 | EXTEND (ONE STEP) |
| 1 | 1 | 1 | 0 | EXTEND (TWO STEPS) |
| 1 | 1 | 1 | 1 | EXTEND (FOUR STEPS) |

EXTEND DELAY TIME ↓ ↑ REDUCE DELAY TIME

SEMICONDUCTOR DEVICE

CROSS-REFERENCE TO RELATED APPLICATION

The disclosure of Japanese Patent Application No. 2013-164053 filed on Aug. 7, 2013 including the specification, drawings and abstract is incorporated herein by reference in its entirety.

BACKGROUND

The present invention relates to a semiconductor device, and can be suitably used, for example, for a semiconductor device including an asynchronous successive approximation type A/D (Analog/Digital) converter.

The synchronous successive approximation type A/D converter can be realized with a relatively simple circuit configuration, but requires a clock signal that oscillates multiple times in the course of A/D conversion. However, in a high-speed system chip, a clock signal having a frequency of several times to several tens of times the frequency of a system clock signal is rarely obtained.

Therefore, there is proposed an asynchronous successive approximation type A/D converter that generates an internal clock signal by a self-loop using a delay circuit and operates in synchronization with the internal clock signal. For example, when the delay circuit is constituted of a plurality of stages of inverters coupled in series, the delay time of the delay circuit fluctuates under the conditions of temperature, processes, power supply voltages, and the like. When the delay time is excessively large, the cycle of the internal clock signal becomes excessively large and thus a desired number of times of comparison operations cannot be performed. Moreover, when the delay time is excessively small, the operation of a peripheral circuit cannot follow the internal clock. Then, Japanese Patent Laid-Open No. 2011-61597 proposes a method for counting the number of falling edges of an internal clock signal with a counter and controlling the delay time of a delay circuit on the basis of the count value.

SUMMARY

However, in Japanese Patent Laid-Open No. 2011-61597, the delay time cannot be accurately controlled because the number of falling edges of the internal clock signal is counted (see FIGS. 15A and 15B).

The other purposes and the new feature of the present invention will become clear from the description of the present specification and the accompanying drawings.

According to an embodiment, through the use of the n-th signal which is output from a sequence register when n times of comparison are completed, it is detected whether or not the n-th signal is output when the period transitions from a comparison period to a sampling period, and the cycle of an internal clock signal is controlled on the basis of the detection result.

According to the embodiment, the cycle of the internal clock signal can be accurately controlled.

BRIEF DESCRIPTION OF THE DRAWINGS

FIG. 19 is a circuit block diagram showing the configuration of an adder/subtraction circuit shown in FIG. 18;

FIG. 20 is a view showing a relationship between signals F1 and F2 and signals AC1 and AC0 shown in FIG. 19;

FIG. 22 is the view showing the operation of the ADC shown in FIG. 21;

DETAILED DESCRIPTION

[First Embodiment]

Figure 1:
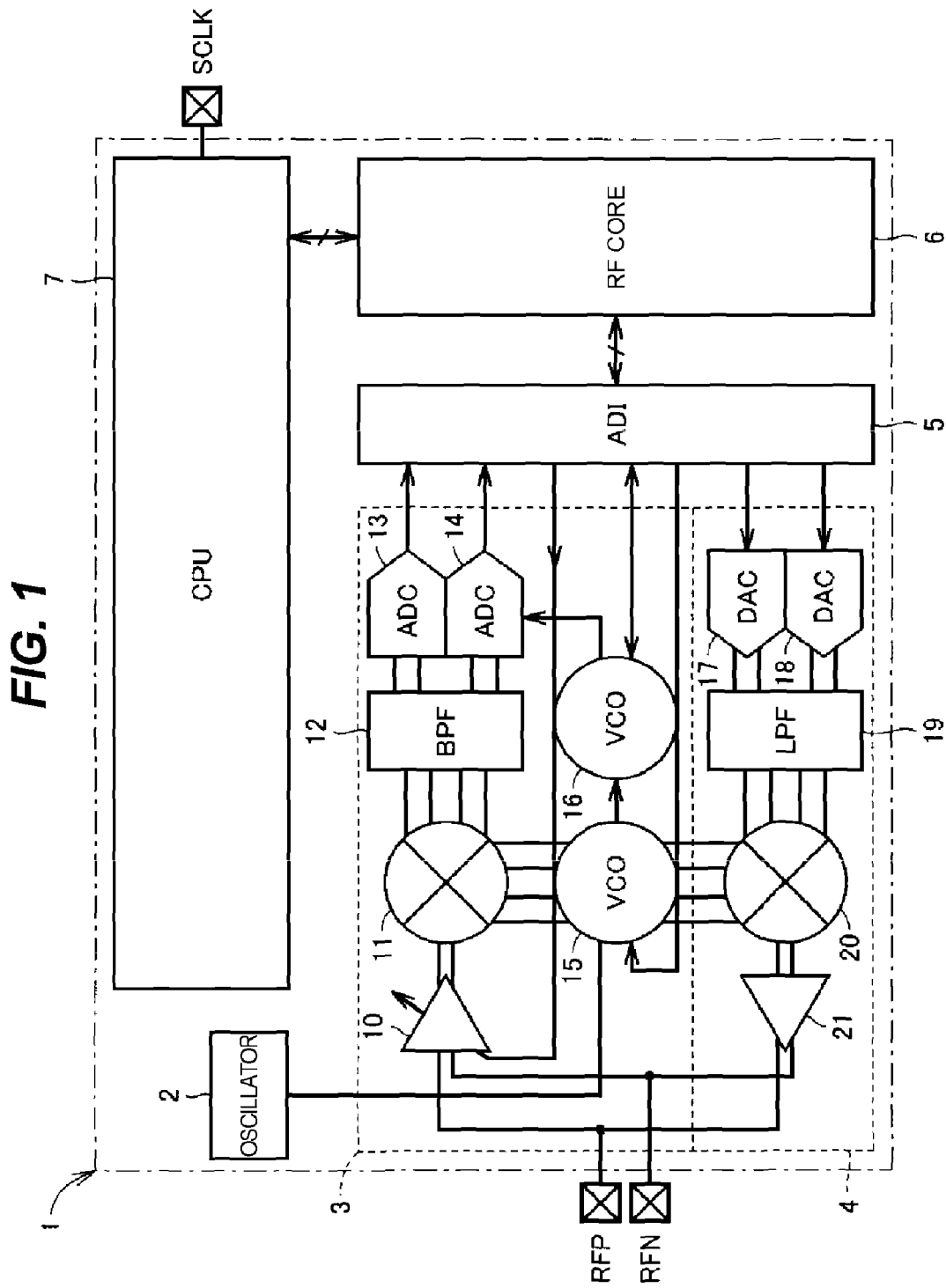
FIG. 1 is a block diagram showing the configuration of a wireless communication semiconductor device according to a first embodiment of the present application.

A wireless communication semiconductor device 1 according to a first embodiment of the present application includes, as shown in FIG. 1, an oscillator 2, a reception system analog circuit 3, a transmission system analog circuit 4, an A/D interface circuit (ADI) 5, an RF (radio frequency) core 6, and a CPU (Central Processing Unit) 7. The oscillator 2 generates an oscillation signal having a predetermined frequency and supplies the same to the reception system analog circuit 3.

The reception system analog circuit 3 includes an LNA (Low Noise Amplifier) 10, a mixer 11, a BPF (Band-pass filter) 12, ADCs (analog to digital converters) 13 and 14, and VCOs (Voltage Controlled oscillators) 15 and 16. The transmission system analog circuit 4 includes DACs (digital to analog converters) 17 and 18, an LPF (Low-pass filter) 19, a mixer 20, and a power amplifier 21.

The VCO 15 generates, on the basis of the oscillation signal generated by the oscillator 2, a local oscillation signal and supplies the same to the mixers 11 and 20. The VCO 16 generates, on the basis of the local oscillation signal generated by the VCO 15, a clock signal and supplies the same to the ADCs 13 and 14.

The A/D interface circuit 5 transmits and receives a signal between the analog circuits 3 and 4 and the RF core 6. The RF core 6 performs signal processing required between the analog circuits 3 and 4 and the CPU 7 and serves as a bridge therebetween. The CPU 7 performs arithmetic processing in synchronization with a system clock signal SCLK.

During reception, RF signals RFP and RFN received with an antenna (not shown) are amplified by the LNA10, are down-converted by the mixer 11, the unnecessary frequency components thereof are removed by the BPF 12, and the RF signals RFP and RFN are converted to digital signals by the ADCs 13 and 14. The digital signals generated by the ADCs 13 and 14 are sent to the CPU 7 via the A/D interface circuit 5 and the RF core 6, and are converted to, for example, an audio signal and an image signal.

During transmission, the digital signal processed by the CPU 7 is converted to analog signals by the DACs 17 and 18, the unnecessary frequency components thereof are removed by the LPF 19, the digital signal is up-converted by the mixer 20, is amplified by the power amplifier 21, and is transmitted via the antenna (not shown).

Figure 2:
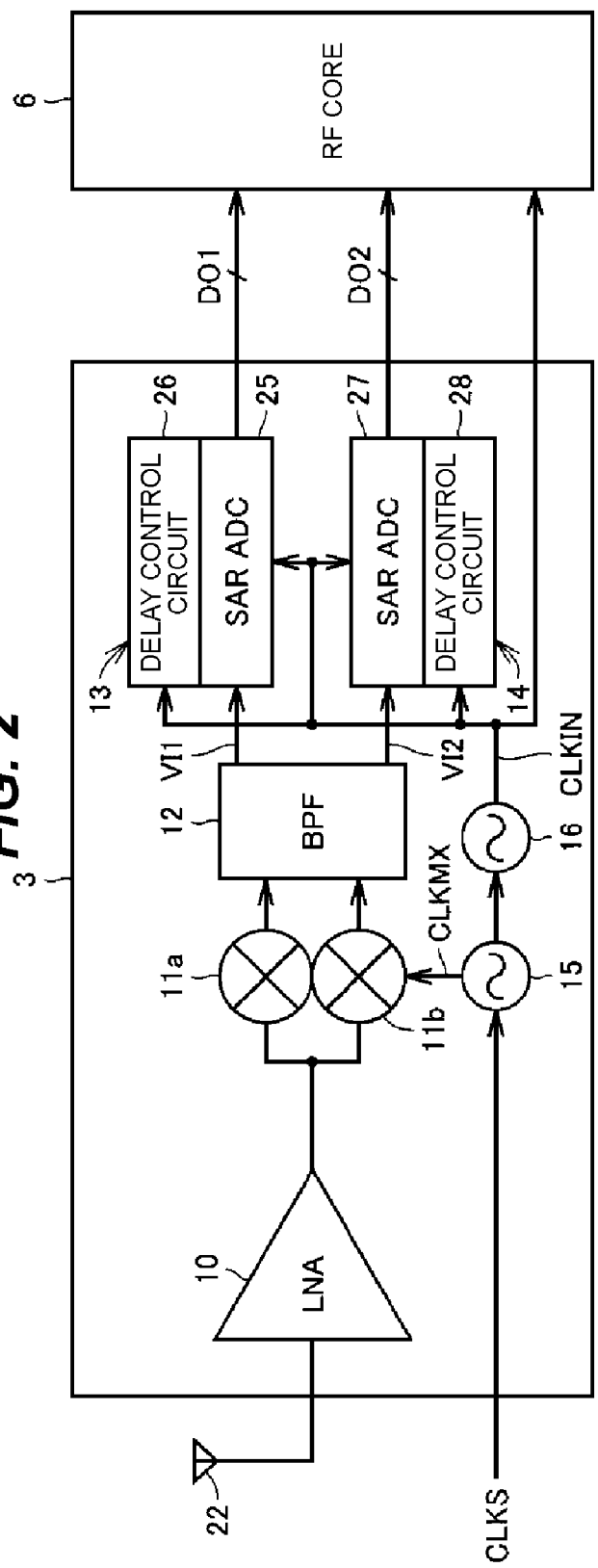
FIG. 2 is a circuit block diagram showing the configuration of a reception system analog circuit shown in FIG. 1.

FIG. 2 is the circuit block diagram showing the configuration of the reception system analog circuit 3. Meanwhile, for simplification of the drawings and description, FIG. 2 shows the circuit diagram of a single-ended signal input/output configuration, although FIG. 1 shows the circuit diagram of a differential signal input/output configuration. Moreover, the illustration of the A/D interface circuit 5 is omitted.

In FIG. 2, an antenna 22 receives an RF signal having a frequency fin (several hundred MHz to several GHz band). The received RF signal is amplified by the LNA10 and then input to the mixers 11a and 11b. The mixers 11a and 11b perform mixing by using a local oscillation signal CLKMX having a frequency fvco (several hundred MHz to several GHz band) generated by the VCO 15, and convert the RF signal to signals VI1 and VI2 of a low frequency band (equal to or less than several MHz).

However, since the output signals of the mixers 11a and 11b include the signals of frequency bands different from the desired signals VI1 and VI2, the signals other than the signals of frequency bands in the vicinity of the signals VI1 and VI2 are attenuated by the BPF 12. The signals VI1 and VI2 passing through the BPF 34 are input to the ADCs 13 and 14, respectively, and are converted to digital signals DO1 and DO2.

Here, the ADC 13 includes an asynchronous successive approximation type ADC (SAR ADC) 25 and a delay control circuit 26. The asynchronous successive approximation type ADC 25 performs A/D conversion in synchronization with a clock signal CLKIN having a frequency fvco2 (several MHz to several ten MHz) generated by the VCO 16. The asynchronous successive approximation type ADC 25 samples the signal VI1 in a sampling period during which the clock signal CLKIN is at an "H" level, and converts the signal VI1 to a multi-bit digital signal DO1 in a comparison period during which the clock signal CLKIN is at an "L" level.

The asynchronous successive approximation type ADC 25 generates an internal clock signal in response to a change of the clock signal CLKIN from an "H" level to an "L" level, and performs A/D conversion in synchronization with the internal clock signal. The asynchronous successive approximation type ADC 25 performs multiple times of comparisons in synchronization with a plurality of leading edges of the internal clock signal, and converts the signal VI1 to the multi-bit digital signal DO1 on the basis of the comparison result.

The internal clock signal is generated inside the asynchronous successive approximation type ADC 25 by a self-loop using the delay circuit. Since the delay time of this delay circuit significantly fluctuates under the conditions of temperature, processes, power supply voltages, and the like as described in the BACKGROUND, there is required a circuit configuration in which the delay time in accordance with a fluctuation in the conditions is controlled. In the first embodiment, there is provided the delay control circuit 26 that detects a signal F1 indicative of the completion of successive approximation and the timing of a rising edge of the clock signal CLKIN and that automatically controls the delay time of the delay circuit inside the internal clock generation circuit.

Similarly, the ADC 14 includes an asynchronous successive approximation type ADC (SAR ADC) 27 and a delay control circuit 28. The asynchronous successive approximation type ADC 27 performs A/D conversion in synchronization with the clock signal CLKIN generated by the VCO 16. The asynchronous successive approximation type ADC 27 samples the signal VI2 in a sampling period during which the clock signal CLKIN is at an "H" level, and converts the signal VI2 to a multi-bit digital signal DO2 in a comparison period during which the clock signal CLKIN is at an "L" level.

The asynchronous successive approximation type ADC 27 generates an internal clock signal in response to a change of the clock signal CLKIN from an "H" level to an "L" level, and performs A/D conversion in synchronization with the internal clock signal. The asynchronous successive approximation type ADC 27 performs multiple times of comparisons in synchronization with the leading edges of the internal clock signal, and converts the signal VI2 to the multi-bit digital signal DO2 on the basis of the comparison result.

The internal clock signal is generated inside the asynchronous successive approximation type ADC 27 by a self-loop using the delay circuit. Since the delay time of this delay circuit significantly fluctuates under the conditions of temperature, processes, power supply voltages, and the like as described in the BACKGROUND, there is required a circuit configuration in which the delay time in accordance with a fluctuation in the conditions is controlled. In the first embodiment, there is provided the delay control circuit 28 that detects a signal F1 indicative of the completion of successive approximation and the timing of a rising edge of the clock signal CLKIN and that automatically controls the delay time of the delay circuit inside the internal clock generation circuit.

Figure 3:
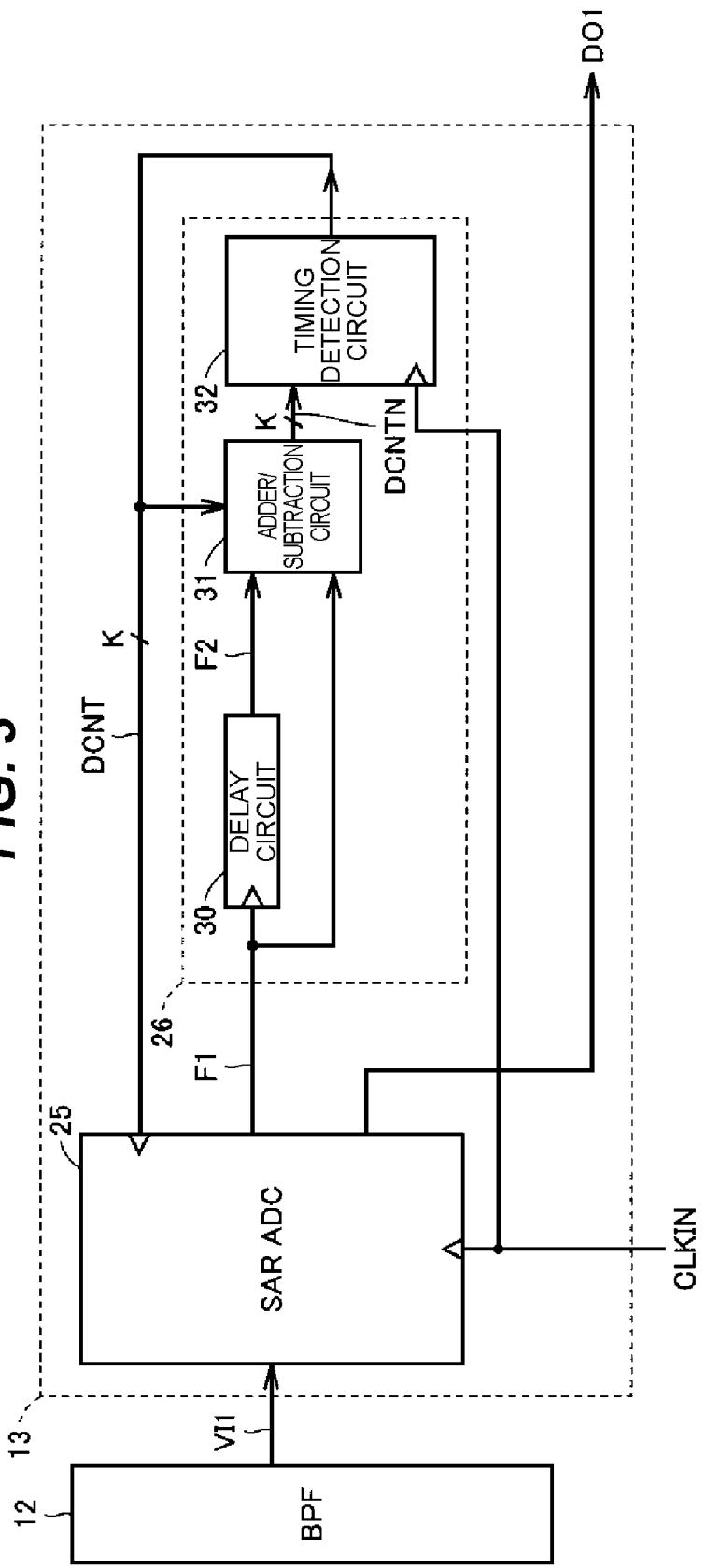
FIG. 3 is a block diagram showing the configuration of an ADC shown in FIG. 2.

FIG. 3 is the block diagram showing the configuration of the ADC 13. In FIG. 3, the ADC 13 includes the asynchronous successive approximation type ADC 25 and the delay control circuit 26. The asynchronous successive approximation type ADC 25 generates an internal clock signal in response to a change of the clock signal CLKIN from an "H" level to an "L" level, and converts the signal VI1 to the digital signal DO1 in synchronization with the internal clock signal. The asynchronous successive approximation type ADC 25 raises the signal F1 from an "L" level to an "H" level when the successive approximation is completed. In addition, the asynchronous successive approximation type ADC 25 modifies the cycle of the internal clock signal in accordance with the delay control signal DCNT.

The delay control circuit 26 include a delay circuit 30, an adder/subtraction circuit 31, and a timing detection circuit 32. The delay circuit 30 delays, by a predetermined time, the signal F1 from the asynchronous successive approximation type ADC 25. An output signal F2 of the delay circuit 30 is raised from an "L" level to an "H" level in a predetermined time after the signal F1 rises from an "L" level to an "H" level.

The adder/subtraction circuit 31 generates a delay control signal DCNTN of K bits on the basis of the signals F1 and F2 and the delay control signal DCNT of the preceding cycle. The timing detection circuit 32 holds and outputs the delay control signal DCNTN in response to the rising edge of the clock signal CLKIN. The output signal of the timing detection circuit 32 serves as the delay control signal DCNT.

If the logic levels of the signal F1 and signal F2 are checked when the clock signal CLKIN is raised from an "L" level to an "H" level and the comparison period is completed, it can be seen whether or not the timing of the completion of successive approximation is appropriate.

For example, when both the signals F1 and F2 are at an "L" level when the clock signal CLKIN is raised from an "L" level to an "H" level and the comparison period ends, the successive approximation is not completed yet. In this case, since the cycle of the internal clock signal is too long, the delay control signal DCNT is generated so that the cycle of the internal clock signal becomes shorter.

On the contrary, if both the signals F1 and F2 are at an "H" level when the clock signal CLKIN is raised from an "L" level to an "H" level and the comparison period ends, the completion of successive approximation is too early. In this case, since the cycle of the internal clock signal is too short, the delay control signal DCNT is generated so that the cycle of the internal clock signal become longer.

In addition, if the signals F1 and F2 are at an "H" level and at an "L" level, respectively, when the clock signal CLKIN is raised from an "L" level to an "H" level and the comparison period ends, the timing of successive approximation is within an allowable range. In this case, since the cycle of the internal clock signal is within an allowable range, the delay control signal DCNT is generated so that the cycle of the internal clock signal is maintained. A method for controlling the delay will be described in detail later.

Figure 4:
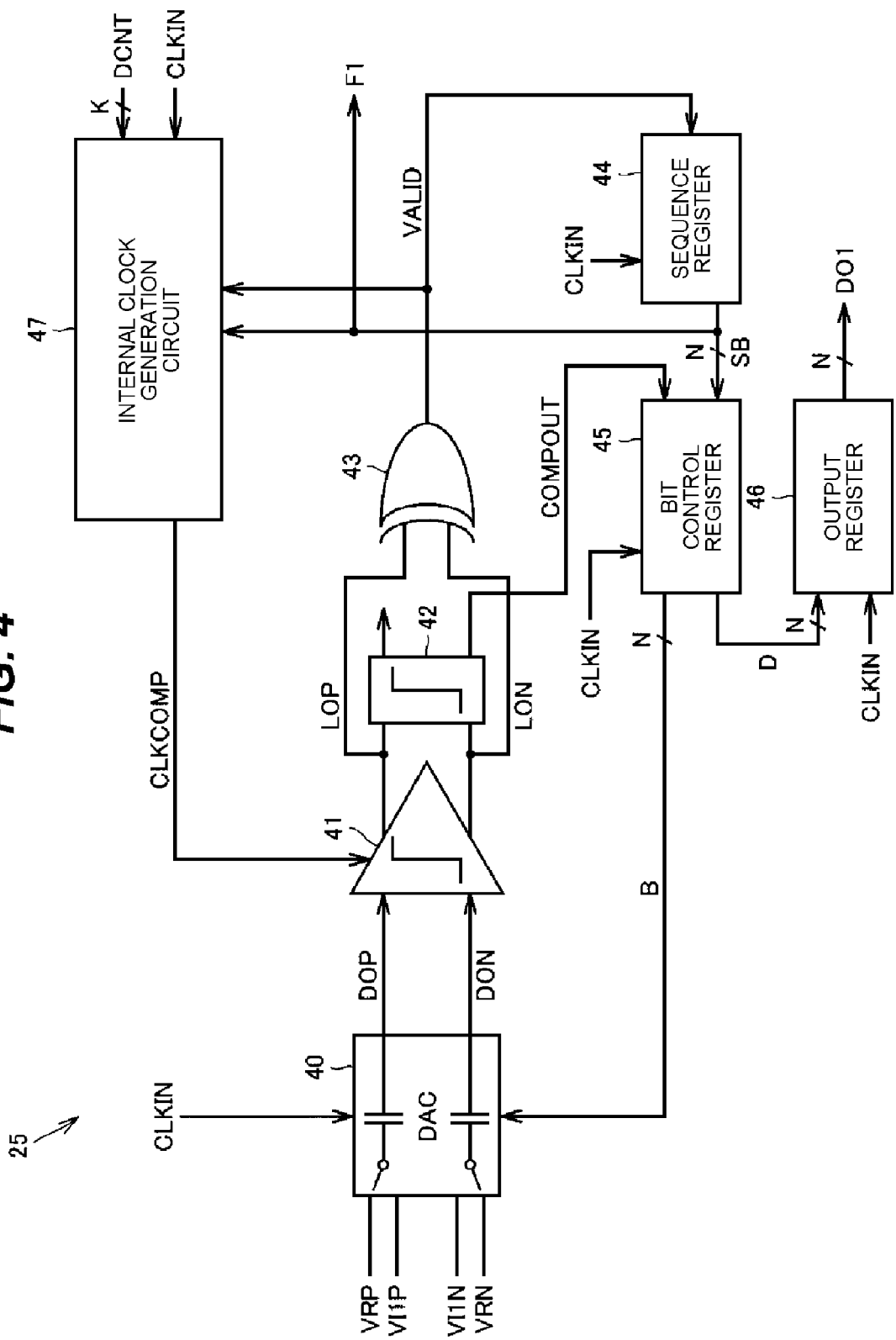
FIG. 4 is a circuit block diagram showing the configuration of an asynchronous successive approximation type ADC shown in FIG. 3.

FIG. 4 is the circuit block diagram showing the configuration of the asynchronous successive approximation type ADC 25, and FIGS. 5A to 5G are the time charts showing the operation of the asynchronous successive approximation type ADC 25. In FIG. 4, the asynchronous successive approximation type ADC 25 includes a DAC 40, a comparator 41, a latch circuit 42, an EX-OR gate 43, a sequence register 44, a bit control register 45, an output register 46, and an internal clock generation circuit 47.

Figure 5:
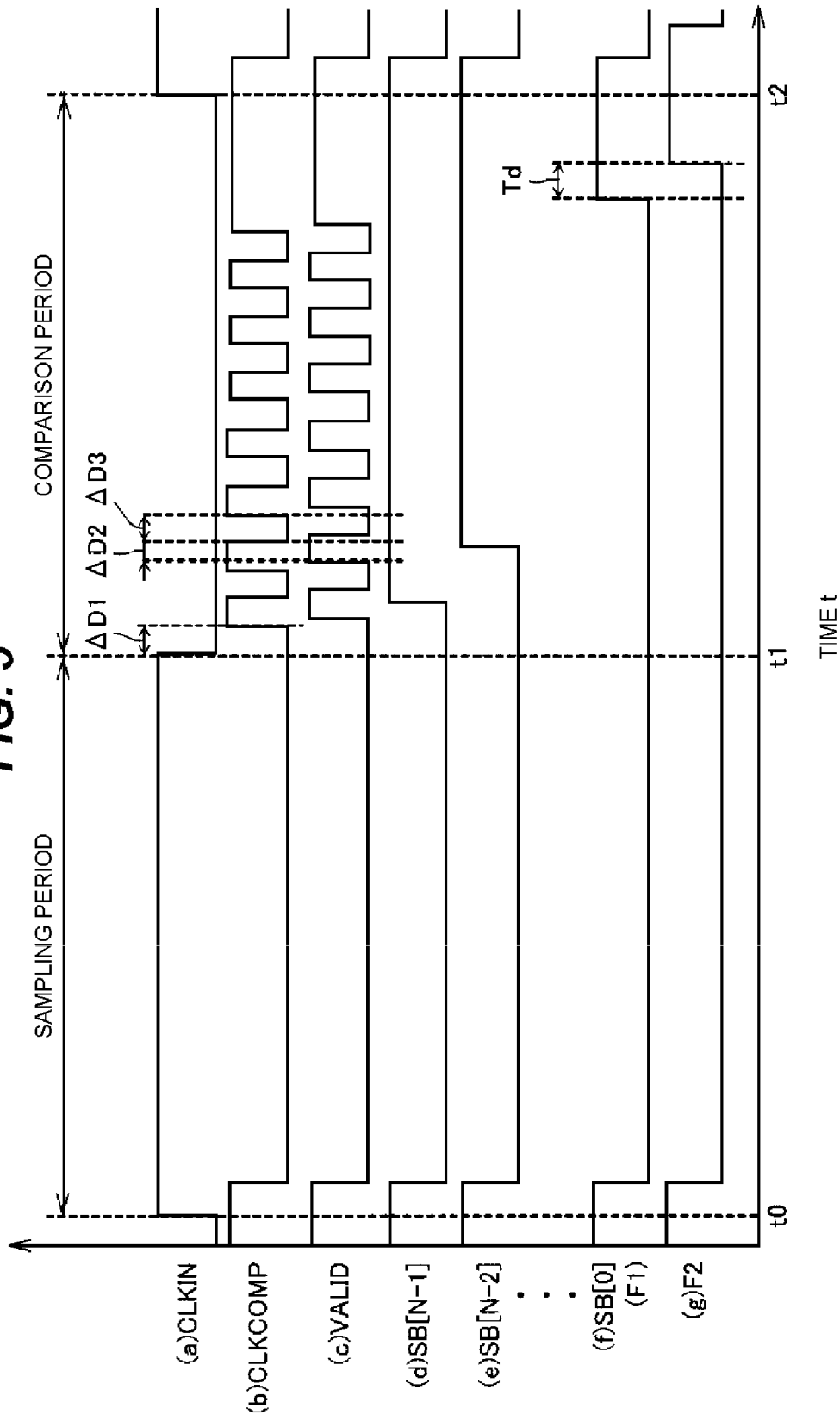
FIGS. 5A to 5G are the time charts showing the operation of the ADC shown in FIG. 1 to FIG. 4.

The DAC 40 plays different roles between in the sampling period and in the comparison period in an asynchronous successive approximation flow. The DAC 40 samples the voltage values of input signals VI1P and VI1N in the sampling period during which the clock signal CLKIN shown in FIG. 5A is at an "H" level. Furthermore, in the comparison period during which the clock signal CLKIN is at an "L" level, the DAC 40 generates comparison voltages DOP and DON corresponding to an N-bit control signal B from the bit control register 45 on the basis of the sampled input signals VI1P and VI1N and reference voltages VRP and VRN.

Meanwhile, although FIG. 4 shows a case where the DAC 40 is a capacitance DAC, the DAC 40 may be a resistor DAC or may be a combination of a capacitance DAC and a resistor DAC, or may have any configuration. Moreover, although FIG. 4 shows a case where the DAC 40 is of a differential signal input/output type, the DAC 40 may be of a single-ended signal input/output type.

In the period during which the internal clock signal CLKCOMP shown in FIG. 5B is at an "H" level, the comparator 41 makes a comparison between the heights of the comparison voltages DOP and DON, and outputs signals LOP and LON on the basis of the comparison result. When DOP>DON holds, the signals LOP and LON are set to an "H" level and an "L" level, respectively. When DOP<DON holds, the signals LOP and LON are set to an "L" level and an "H" level, respectively.

Moreover, the comparator 41 is reset in the period during which the internal clock signal CLKCOMP is at an "L" level. At this time, both the signals LOP and LON are set to an "H" level (power supply voltage) or an "L" level (ground voltage) in preparation for the next comparison operation. Although FIG. 4 shows a case where the comparator 41 is of a differential signal input/output type, the comparator 41 may be of a single-ended signal input/output type.

Meanwhile, in the sampling period during which the clock signal CLKIN is at an "H" level, the comparator 41 is always put into a reset state in the sampling period because the internal clock signal CLKCOMP is fixed to an "L" level.

The latch circuit 42 takes in the output signals LOP and LON of the comparator 41 when the internal clock signal CLKCOMP changes from an "H" level to an "L" level, and holds the values of these signals LOP and LON at least until the internal clock signal CLKCOMP changes from an "L" level to an "H" level. Either one signal (the signal LON, in the view) of the output signals of the latch circuit 42 is supplied to the bit control register 45 as a comparison result signal COMPOUT.

The EX-OR gate 43 outputs an exclusive OR signal VALID of the output signals LOP and LON of the comparator 41. In the period during which the internal clock signal CLKCOMP is at an "L" level, the signal VALID becomes an "L" level because both the output signals LOP and LON of the comparator 41 are reset to an "H" level (or an "L" level).

After the internal clock signal CLKCOMP transitions from an "L" level to an "H" level, determination is made by the comparator 41, and when the output signals LOP and LON of the comparator 41 are determined as an "H" level and an "L" level or an "L" level and an "H" level, the signal VALID becomes an "H" level. The change of the signal VALID from an "L" level to an "H" level means that the comparison by the comparator 41 is completed, and this signal VALID is supplied to the sequence register 44 and the internal clock generation circuit 47.

Meanwhile, although FIG. 4 shows a case where the latch circuit 42 is of a differential signal input/output type, the latch circuit 42 may be of a single-ended signal input/output type. In addition, the latch circuit 42 may be either of an edge trigger type where the output thereof changes only at an edge position of a clock signal or a transparent type where the input signal passes there through in an "open" period.

The signal processing flow subsequent to the latch circuit 42 is divided mainly into two types. One is a successive approximation process flow from the sequence register 44 to the DAC 40 via the bit control register 45. The other is an internal clock generation flow from the internal clock generation circuit 47 to the comparator 41. Hereinafter, the respective signal processing flows will be described.

Figure 6:
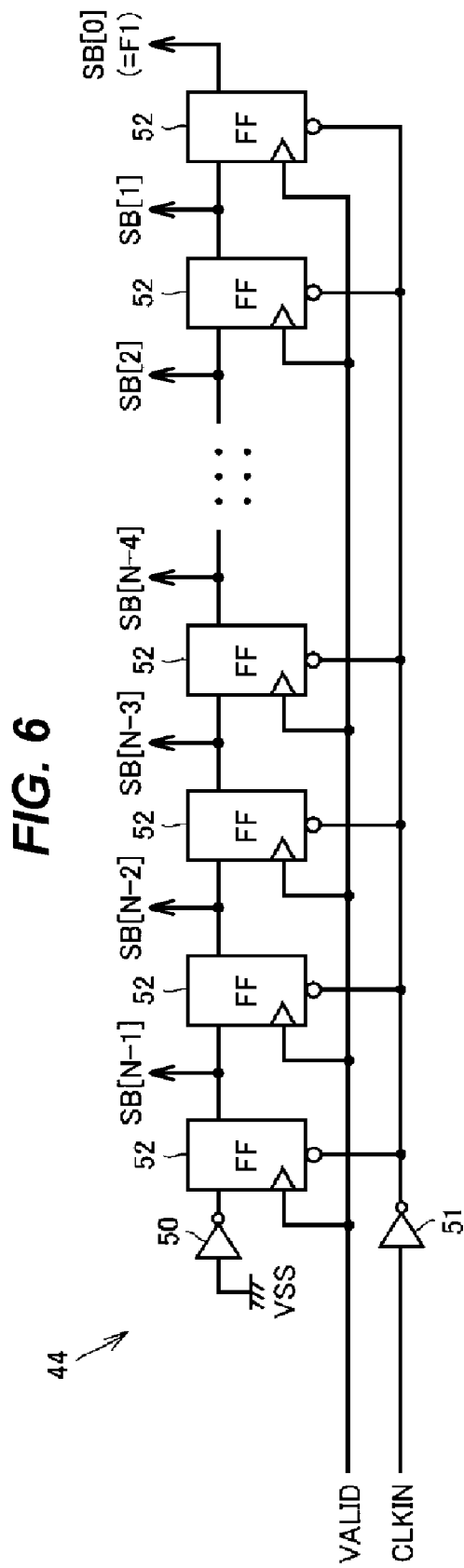
FIG. 6 is a circuit block diagram showing the configuration of a sequence register shown in FIG. 4.

First, the successive approximation process flow from the sequence register 44 to the DAC 40 via the bit control register 45 will be described. The sequence register 44 is a circuit for controlling the number of times of comparison of N comparisons is to be performed. The sequence register 44 includes inverter 50 and 51, and N flip-flops (FFs) 52 coupled in series as shown in FIG. 6. The flip-flop 52 is of a positive-edge trigger type. The inverter 50 supplies a signal of an "H" level to a data input terminal of the flip-flop 52 of the first stage. The signal VALID is supplied to a clock terminal of each flip-flop 52. The clock signal CLKIN is inverted by the inverter 51 and supplied to a reset terminal of each flip-flop 52. The N stages of flip-flops 52 output signals SB[N−1] to SB[0], respectively.

In the sampling period during which the clock signal CLKIN is at an "H" level, all the flip-flops 52 are in a reset state and the output signals thereof are fixed to an "L" level. In the comparison period during which the clock signal CLKIN is at an "L" level, as shown in FIGS. 5A to 5F, every time the signal VALID transitions from an "L" level to an "H" level, the signals SB[N−1] to SB[0] successively change from an "L" level to an "H" level one by one.

Figure 7:
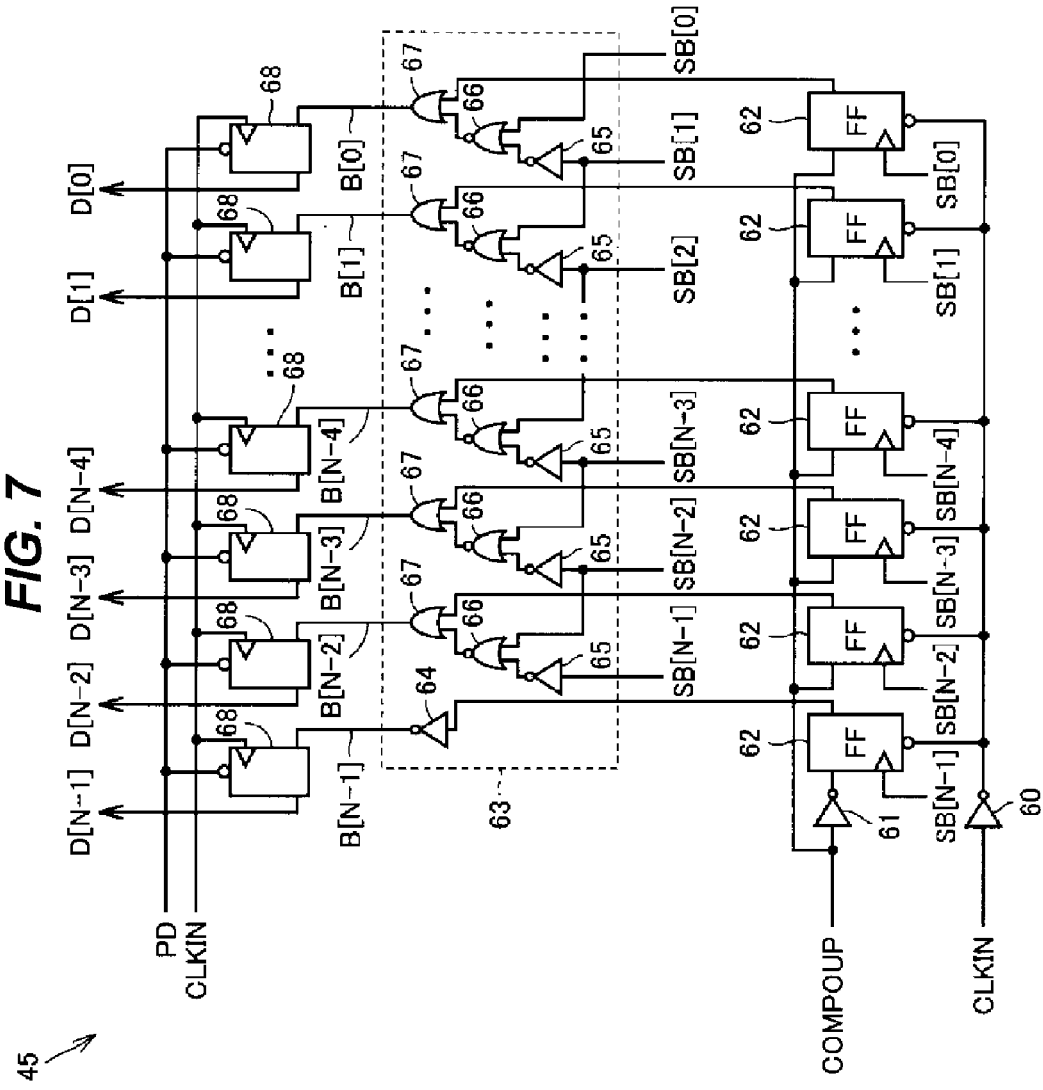
FIG. 7 is a circuit block diagram showing the configuration of a bit control register shown in FIG. 4.

FIG. 7 is a circuit diagram showing the configuration of the bit control register 45. In FIG. 7, the bit control register 45 includes inverters 60 and 61, N flip-flops (FFs) 62, a logic circuit 63, and N latch circuits 68. The logic circuit 63 includes an inverter 64, (N−1) sets of inverters 65, an NOR gate 66, and an OR gate 67.

The clock signal CLKIN is inverted by the inverter 60 and supplied to a reset terminal of each flip-flop 62. The signals SB[N−1] to SB[0] are supplied to clock terminals of the N flip-flops 62, respectively. The signal COMPOUT is inverted by the inverter 61 and supplied to the data input terminal of the flip-flop 62 of the [N−1]th stage (first stage) and also supplied directly to the data input terminal of each of the other flip-flops 62. The output signal of each flip-flop 62 is supplied to the logic circuit 63.

The logic circuit 63 generates signals B[N−1] to B[0] on the basis of the output signals of the N flip-flops 62 and the signals B[N−1] to B[0]. The inverter 64 inverts the output signal of the flip-flop 62 of the [N−1]th stage to generate the signal B[N−1]. The (N−1) inverters 65 invert the signals SB[N−1] to SB[1], respectively. One input node of each of (N−1) NOR gates 66 receives the output signal of each of the (N−1) inverters 65, respectively, and the other input node thereof receives each of the signals SB[N−2] to SB[0], respectively.

One input node of each of the (N−1) OR gates 67 receives the output signal of each of the (N−1) NOR gates, respectively, and the other input node receive the output signal of each of the flip-flop 62 of the [N−2]th stage to [0]th stage, respectively, and the output signals of the OR gates 67 serve as the signals B[N−2] to B[0], respectively.

Each of the signals B[N−1] to B[0] is supplied to the input terminal of each of the N latch circuits 68, respectively. A power down signal PD is supplied to the reset terminal of each latch circuit 68. The clock signal CLKIN is supplied to the clock terminal of each latch circuit 68. The output signals of the N latch circuits 68 serve as data signals D[N−1] to D[0], respectively.

In the sampling period during which the clock signal CLKIN is at an "H" level, all the N flip-flops 62 are in a reset state and all the output signals thereof are at an "L" level. The output signals of the N flip-flops 62 are input to the logic circuit 63. The logic circuit 63 generates bit control signals B[N−1] to B[0]. During the first comparison, only the signal B[N−1] is set to an "H" level, and all the rest signals B[N−2] to B[0] are set to an "L" level.

On the other hand, the N latch circuits 68 hold the bit control signals B[N−1] to B[0] when the clock signal CLKIN previously transitioned from an "L" level to an "H", as the A/D conversion result signals D[N−1] to D[0].

When the clock signal CLKIN transitions from an "H" level to an "L" level and the state switches from the sampling period to the comparison period, the reset state of each flip-flop 62 is released. However, at this time, the signals B[N−1] to B[0] do not change because the signals B[N−1] to B[0] are not changed yet.

On the other hand, each latch circuit 68 becomes an open state, and the values of the output signals D[N−1] to D[0] are updated to the same values as the signals B[N−1] to B[0]. That is, only the signal D[N−1] becomes an "H" level ("1") and all the other signals D[N−2] to D[0] become at an "L" level ("0"). In addition, in the DAC 40, the output voltages DOP and DON corresponding to bit control codes B [N−1] to B[0] are generated from the input signals VI1P and VI1N and the reference voltages VRP and VRN.

After the clock signal CLKIN transitions from an "H" level to an "L" level, the internal clock signal CLKCOMP is delayed by ΔD1 shown in FIGS. 5A and 5B and transitions from an "L" level to an "H" level and then the comparison is made by the comparator 41. When the output signals LOP and LON of the comparator 41 become an "H" level and an "L" level or an "L" level and an "H" level, respectively, an output signal VALID of the EX-OR gate 43 transitions from an "L" level to an "H" level.

Since the signal VALID is input to the clock terminals of all the flip-flops 52 of the sequence register 44 as shown in FIG. 6, a signal capture operation is performed by all the flip-flops 52 when the signal VALID transitions from an "L" level to an "H" level. At this time, since only the flip-flop 52 of the [N−1]th stage (first stage) takes in the signal of an "H" level and each of the other flip-flops 52 takes in the signal of an "L" level, only the signal SB[N−1] transitions from an "L" level to an "H" level.

When the signal SB[N−1] transitions from an "L" level to an "H" level, the flip-flop 62 of the [N−1]th stage of the bit control register 45 of FIG. 7 takes in an inverted signal of the comparison result signal COMPOUT, and depending on the comparison result, the signal B[N−1] is maintained at an "H" level or transitions to an "L" level.

On the other hand, the signal SB[N−1] of an "H" level is input also to the logic circuit 63. At this time, since the signal SB[N−2] is still at an "L" level, the signal B[N−2] transitions from an "L" level to an "H" level.

In the DAC 40, the output voltages DOP and DON for the next comparison are newly generated by the bit control code B which sets the updated signals B[N−1] and B[N−2] as an "H" level and sets all the signals B[N−3] to B[0] as an "L" level.

Hereinafter, a series of processes is repeated, including comparison by the comparator 41, latch by the latch circuit 42, generation of the signal VALID by the EX-OR gate 43, update of the sequence control code SB by the sequence register 53, update of the bit control code B by the bit control register 45, generation of a comparison voltage by the DAC 40, comparison by the comparator 41, and the like. These processes are performed until the signal COMPOUT is taken in by the flip-flop 62 of the [0]th stage (final stage), that is, until the comparison of the minimum bits is completed.

Figure 8:
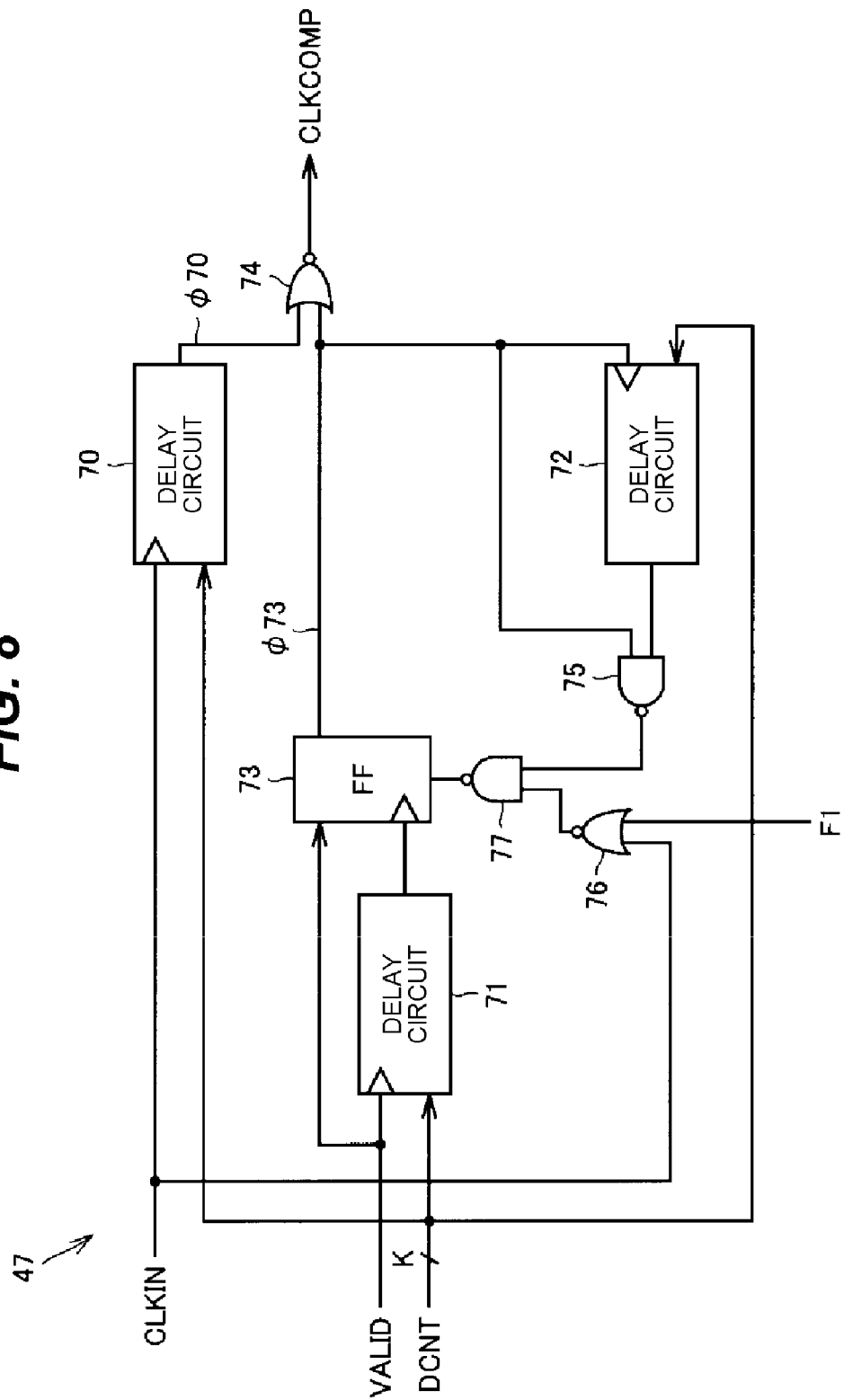
FIG. 8 is a circuit block diagram showing the configuration of an internal clock generation circuit shown in FIG. 4.

Next, the internal clock generation flow from the internal clock generation circuit 47 to the comparator 41 will be described. FIG. 8 is the circuit block diagram showing the configuration of the internal clock generation circuit 47. In FIG. 8, the internal clock generation circuit 47 includes delay circuits 70 to 72, a flip-flop 73, NOR gates 74 and 76, and NAND gates 75 and 77.

The respective delay times of the delay circuits 70 to 72 are controllable by a K-bit delay control signal DCNT. The clock signal CLKIN is supplied to one input node of the NOR gate 74 via the delay circuit 70 and also supplied to one input node of the NOR gate 76. The signal F1 is supplied to the other input node of the NOR gate 76. The signal VALID is supplied to the clock terminal of the flip-flop 73 via the delay circuit 71 and also supplied directly to the data input terminal of the flip-flop 73.

The output signal of the flip-flop 73 is supplied to the other input node of the NOR gate 74. The output signal of the NOR gate 74 serves as the internal clock signal CLKCOMP. In addition, the output signal of the flip-flop 73 is supplied directly to one input node of the NAND gate 75 and also supplied to the other input node of the NAND gate 75 via the delay circuit 72. The NAND gate 77 receives the output signals of the NAND gate 75 and the NOR gate 76. The output signal of the NAND gate 77 is supplied to the reset terminal of the flip-flop 73.

In the sampling period during which the clock signal CLKIN is at an "H" level, since an output signal $\phi70$ of the delay circuit 70 is also at an "H" level, the internal clock signal CLKCOMP is fixed to an "L" level as shown in FIGS. 5A and 5B. Furthermore, because the reset terminal of the flip-flop 73 is fixed to an "H" level, an output signal $\phi73$ of the flip-flop 73 is also fixed to an "L" level.

When the clock signal CLKIN transitions from an "H" level to an "L" level, that is, transitions from the sampling period to the comparison period, the reset terminal of the flip-flop 73 becomes an "L" level and the reset of the flip-flop 73 is released. However, at this time point, since the signal VALID remains at an "L" level and does not change, the output signal $\phi73$ of the flip-flop 73 remains at an "L" level.

When the output signal $\phi70$ of the delay circuit 70 is delayed by a delay time $\Delta D1$ of the delay circuit 70 and changes from an "H" level to an "L" level after the clock signal CLKIN changes from an "H" level to an "L" level, the internal clock signal CLKCOMP changes from an "L" level to an "H" level and the first comparison operation is started in the comparator 41.

The determination by the comparator 41 is made as previously described, and when the output signals LOP and LON become an "H" level and an "L" level or an "L" level and an "H" level, respectively, the output signal VALID of the EX-OR gate 43 changes from an "L" level to an "H" level.

The signal VALID of an "H" level is input to the data input terminal of the flip-flop 73 without a delay and is also delayed by $\Delta D2$ of FIGS. 5B and 5C by the delay circuit 71 and input to the clock terminal of the flip-flop 73. Therefore, the signal VALID of an "H" level is taken in by the flip-flop 73, and the output signal $\phi73$ of the flip-flop 73 changes from an "L" level to an "H" level. When the signal $\phi73$ changes to an "H" level, the internal clock signal CLKCOMP changes from an "H" level to an "L" level because the signal $\phi70$ is at an "L" level.

On the other hand, the signal $\phi73$ transmits also to the delay circuit 72 and the NAND gate 75. The change from an "L" level to an "H" level of the signal $\phi73$ transmits to one input node of the NAND gate 75 without a delay. However, at this time, since the other input node of the NAND gate 75 still remains at an "L" level, the output signal of the NAND gate 75 remains at an "H" level and does not change. Because the output signal of the delay circuit 72 is delayed by $\Delta D3$ shown in FIGS. 5B and 5C and changes to an "H" level, the output signal of the NAND gate 75 changes from an "H" level to an "L" level. When the output signal of the NAND gate 75 changes to an "L" level, the reset terminal of the flip-flop 73 becomes an "H" level and the output signal $\phi73$ of the flip-flop 73 changes from an "H" level to an "L" level.

Once the signal $\phi73$ changes to an "L" level, since the output signal of the delay circuit 70 is at an "L" level, the internal clock signal CLKCOMP changes from an "L" level to an "H" level and the comparison operation is started again. On the other hand, when the change to an "L" level of the signal $\phi73$ transmits to one input node of the NAND gate 75 without a delay, the output signal of the NAND gate 75 changes from an "L" level to an "H" level immediately. Therefore, the reset terminal of the flip-flop 73 becomes an "L" level and the reset state of the flip-flop 73 is released.

Such an operation is repeated until the signal F1 is raised from an "L" level to an "H" level. When the signal F1 is set to an "H" level, the output signal of the NOR gate 76 becomes an "L" level and the output signal of the NAND gate 77 becomes an "H" level. Therefore, the flip-flop 73 is reset, the signal $\phi73$ becomes an "L" level, the internal clock signal CLKCOMP is fixed to an "H" level, and the signal VALID is also fixed to an "H" level.

When the clock signal CLKIN changes from an "L" level to an "H" level, the signal $\phi70$ is delayed by the delay time $\Delta D1$ of the delay circuit 70 and changes to an "H" level and the internal clock signal CLKCOMP is fixed to an "L" level.

Figure 9:
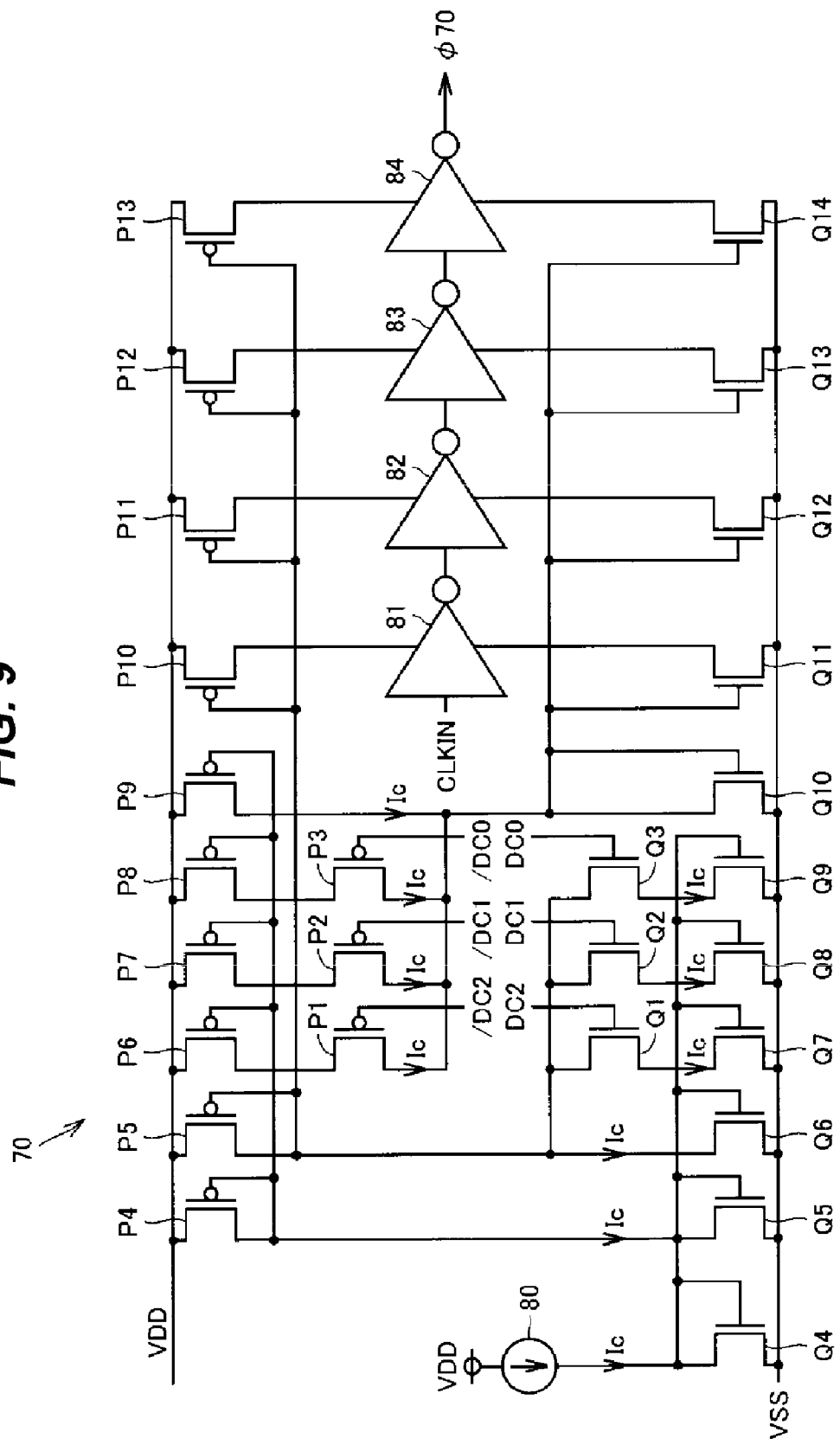
FIG. 9 is a circuit diagram showing the configuration of a delay circuit shown in FIG. 8.

FIG. 9 is a circuit diagram showing the configuration of the delay circuit 70. In FIG. 9, the delay circuit 70 includes P-channel MOS transistors P1 to P13, N-channel MOS transistors Q1 to Q13, a constant current source 80, and inverters 81 to 84.

All the sources of the P-channel MOS transistors P4 to P13 receive a power supply voltage VDD, and all the sources of the N-channel MOS transistors Q4 to Q14 receive a ground voltage VSS. The constant current source 80 is coupled between the line of power supply voltage VDD and the drain of the transistor Q4 and supplies a constant current Ic. All the gates of the transistors Q4 to Q9 are coupled to the drain of the transistor Q4. The drains of the transistors P4 and P5 are coupled to each other and all the gates of the transistor P4 and P6 to P9 are coupled to the drain of the transistor P4.

The drains of the transistors P5 and P6 are coupled to each other, and all the gates of the transistor P5 and P10 to P13 are coupled to the drain of the transistor P5. The drains of the transistors P9 and Q10 are coupled to each other, and all the gates of the transistors Q10 to Q14 are coupled to the drain of the transistor Q10.

The inverters 81 to 84 are coupled in series between the input node and output node of the delay circuit 70. The clock signal CLKIN is delayed by the inverters 81 to 84 and serves as the signal $\phi70$. The drains of the transistors P10 to P13 are coupled to the power supply nodes of the inverters 81 to 84, respectively. The drains of the transistors Q11 to Q14 are coupled to the ground node of the inverters 81 to 84, respectively.

The sources of the transistors Q1 to Q3 are coupled to the drains of the transistors Q7 to Q9, respectively, all the drains of the transistors Q1 to Q3 are coupled to the drain of the transistor Q6, and the gates of the transistors Q1 to Q3 receive data signals DC2 to DC0, respectively.

The sources of the transistors P1 to P3 are coupled to the drain of the transistors P6 to P8, respectively, all the drains of the transistors P1 to P3 are coupled to the drain of the transistor P9, and the gates of the transistors P1 to P3 receive data signals /DC2 to /DC0, respectively. The data signals /DC2 to /DC0 are the inverted signals of the data signals DC2 to DC0, respectively. The data signals DC2 to DC0 are the signals included in the delay control signal DCNT.

The sizes (i.e., current drive capabilities) of the transistors P4, P6 to P9 are the same, and the sizes (i.e., current drive capabilities) of the transistors Q4 to Q9 are the same. Moreover, the sizes (i.e., current drive capabilities) of the transistors P5, P10 to P13 are the same, and the sizes (i.e., current drive capabilities) of the transistors Q10 to Q14 are the same. The sizes of the transistors P1 to P3 are sufficiently large as compared with the transistors P4 to P13, and the sizes of the transistors Q1 to Q3 are sufficiently large as compared with the transistors Q4 to Q14. Each of the transistors P1 to P3 and Q1 to Q3 constitutes a switch, and the transistors P4 to P13 and Q4 to Q14 constitute a current mirror circuit.

When the power supply currents of the inverters 81 to 84 increase, the delay time of each of the inverters 81 to 84 decreases. For example, when all the signals DC2 to DC0 are at an "L" level, all the transistors P1 to P3 and Q1 to Q3 become non-conductive. In this case, the current Ic flows through the transistors P10 to P13 and Q10 to Q13, respectively. Moreover, when all the signals DC2 to DC0 are at an "H" level, all the transistors P1 to P3 and Q1 to Q3 are electrically conducted. In this case, a current 4×Ic flows through each of the transistors P10 to P13 and Q10 to Q13. Accordingly, the delay time of the delay circuit 70 can be controlled by the data signals DC2 to DC0.

Meanwhile, although the configuration of the delay circuit 70 is shown in FIG. 9, the configuration of FIG. 9 is just one example, and any configuration may be employed as long as the delay time can be controlled. Furthermore, the delay circuit 70 may delay, invert, and output the input signal. Moreover, since the delay circuits 71 and 72 are the same as the delay circuit 70, the description thereof is not repeated.

Returning to FIG. 4, the output register 46, upon receipt of the output signals D [N−1] to D [0] of the bit control register 45, takes in the signals D [N−1] to D [0] at a timing when the clock signal CLKIN changes from the comparison period to the sampling period, and continues to output the signals D [N−1] to D [0] as an A/D conversion result till the next sampling period ends. The output register 46 is usually constituted from the same number of flip-flops as the number of bits of the signals D [N−1] to D [0].

Whether or not such an asynchronous successive approximation type ADC 25 has performed a desired operation, that is, whether or not N times of comparison operations have been successfully performed, can be determined by detecting whether or not the output signal SB [0] of the sequence register 44 is at an "H" level at a timing when the clock signal CLKIN changes from an "L" level to an "H" level.

In addition, whether or not the cycle of the internal clock signal CLKCOMP is too short when the comparison operation has been successfully performed can be determined by detecting a time period until the clock signal CLKIN changes from an "L" level to an "H" level, after the signal SB[0] changes from an "L" level to an "H" level.

Accordingly, both a problem in which the cycle of the internal clock signal CLKCOMP becomes longer and a desired number of times of comparison cannot be made and a problem in which the cycle of the internal clock signal CLKCOMP becomes shorter and the operation of the peripheral circuit cannot follow the internal clock signal CLKCOMP can be solved by detecting the change timings of two signals of the signal SB[0] and the clock signal CLKIN, and feeding back the information as the signal DCNT to the delay circuits 70 to 72.

Returning to FIG. 3, the signal F1 (=SB[0]) is extracted as a timing detection signal from the asynchronous successive approximation type ADC 25. The signal F1 is delayed by a delay time Td by the delay circuit 30, and serves as the signal F2. The signals F1 and F2 and the delay control signal DCNT, which was determined at the time of completion of the comparison period one cycle earlier, are input to the adder/subtraction circuit 31. In the adder/subtraction circuit 31, the value of the delay control signal DCNTN is controlled at the change timings of the signals F1 and F2 during the comparison period.

Figures 10, 11:
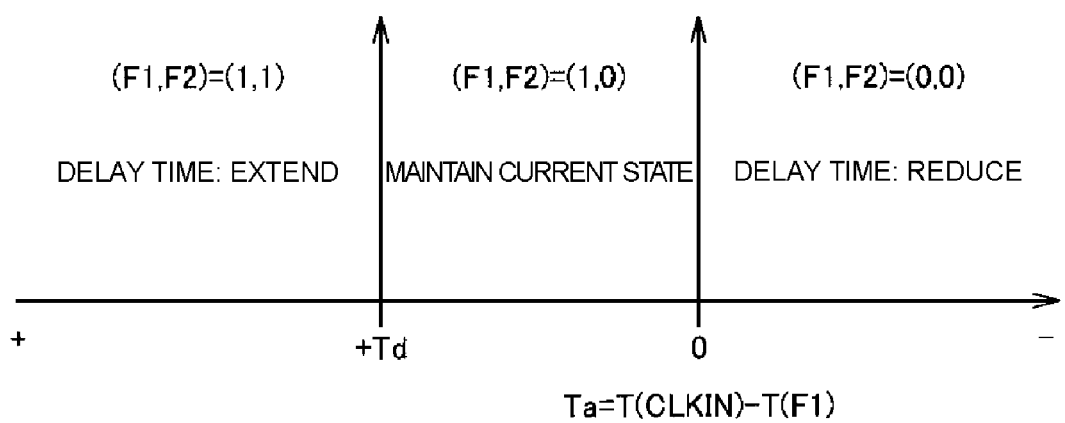
FIG. 10 is a view showing the operation of a delay control circuit shown in FIG. 3.
FIG. 11 is another view showing the operation of the delay control circuit shown in FIG. 3.
Figure 12:
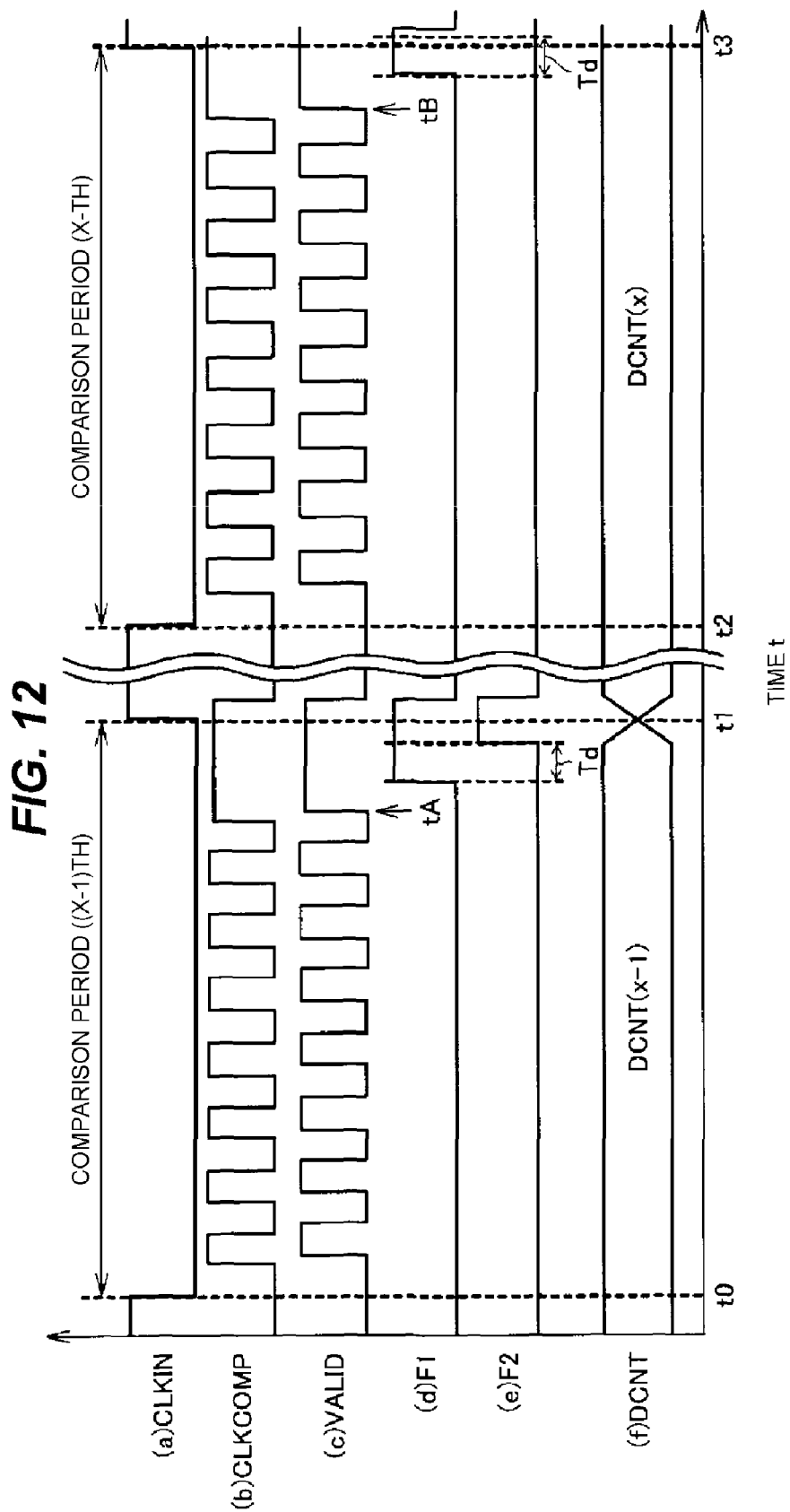
FIGS. 12A to 12F are the time charts showing the delay control action of the ADC shown in FIG. 1 to FIG. 4.
Figure 13:
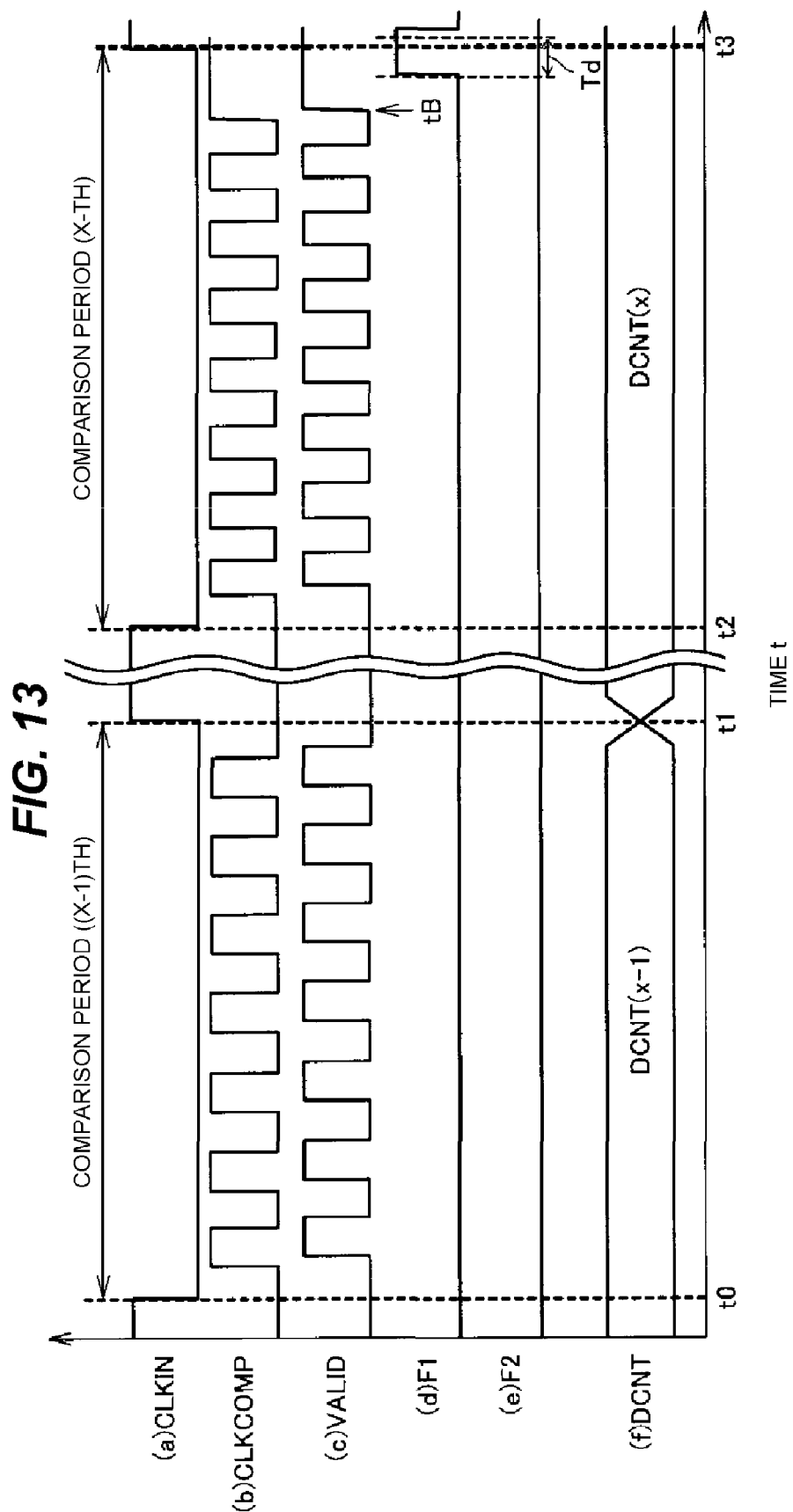
FIGS. 13A to 13F are the time charts showing the delay control action of the ADC shown in FIG. 1 to FIG. 4.

FIG. 10 is a view showing a relationship between the signals F1 and F2 and the delay control signal DCNTN. In FIG. 10, when the signals F1 and F2 are 0 ("L" level) and 0 ("L" level), respectively, a value obtained by adding 1 to the value of the signal DCNT is set to the value of the signal DCNTN (DCNT+1=DCNTN). Since the signal F2 is the signal obtained by delaying the signal F1, there is no case where the signals F1 and F2 are 0 ("L" level) and 1 ("H" level), respectively. When the signals F1 and F2 are 1 and 0, respectively, the value of the signal DCNT is set, as it is, to the value of the signal DCNTN (DCNT=DCNTN). When the signals F1 and F2 are 1 and 1, respectively, a value obtained by subtracting 1 from the value of the signal DCNT is set to the value of the signal DCNTN (DCNT−1=DCNTN).

At a timing when the clock signal CLKIN changes from an "L" level to an "H" level, the signal DCNTN is taken in by the timing detection circuit 43. The signal DCNTN taken in is used as the delay control signal DCNT in the next comparison period. When the value of the signal DCNT is incremented by 1, the delay times of the delay circuits 70 to 72 are reduced and the cycle of the internal clock signal CLKCOMP decreases. When the value of the signal DCNT is maintained, the delay times of the delay circuits 70 to 72 are maintained and the cycle of the internal clock signal CLKCOMP is maintained. When the value of the signal DCNT is decremented by 1, the delay times of the delay circuits 70 to 72 are extended and the cycle of the internal clock signal CLKCOMP increases.

FIG. 11 is a view showing a relationship between the timings of the rising edges of the clock signal CLKIN and signal F1 and the delay time of the delay circuits 70 to 72. The horizontal axis of FIG. 11 represents a time difference Ta=T (CLKIN)−T(F1) between the rising edge of the clock signal CLKIN and the rising edge of the signal F1.

In the case of Ta>Td, since the timing of the completion of successive approximation is too early, the delay times of the delay circuits 70 to 72 are extended and thus the cycle of the internal clock signal CLKCOMP is extended. In the case of Td>Ta>0, since the timing of the completion of successive approximation is appropriate, the delay times of the delay circuits 70 to 72 are maintained and thus the cycle of the internal clock signal CLKCOMP is maintained. In the case of 0>Ta, since the timing of the completion of successive approximation is too late, the delay times of the delay circuits 70 to 72 are reduced and thus the cycle of the internal clock signal CLKCOMP is shortened. When the relationship between the signal CLKIN and the signal F1 transitions to the region where the current state is maintained or when the value of the delay control signal DCNT becomes the maximum or the minimum, the automatic control of the delay time is completed.

FIGS. 12A to 12F are the time charts showing the delay control action of the ADC 13. FIGS. 12A to 12F show a case where the value of the delay control signal DCNT is modified in a direction of increasing the delay time and the relationship between the signal CLKIN and the signal F1 transitions to the region where the current state is maintained. Meanwhile, for convenience of description, the resolution of the asynchronous successive approximation type ADC 25 is assumed to be 8 bits. In addition, it is assumed that when the value of the delay control signal DCNT is incremented by "1", the delay time is reduced by one step, whereas when the value of the delay control signal DCNT in decremented by "1", the delay time is extended by one step.

Here, since the resolution is assumed to be 8 bits, if the comparison operation is performed eight times and a change from an "L" level to an "H" level occurs eight times in the signal VALID, the signal F1 (=SB[0]) indicative of completion of the successive approximation operation changes from an "L" level to an "H" level. In the (x−1)th comparison period of FIGS. 12A to 12F, at a timing designated by tA, the eighth change from an "L" level to an "H" level of the signal VALID occurs, and the signal F1 is delayed by the delay time of the flip-flop 52 of FIG. 6 from this change and rises from an "L" level to an "H" level.

After the signal F1 changes to an "H" level, the signal F2 is delayed by the delay time Td of the delay circuit 30 of FIG. 3 and changes from an "L" level to an "H" level. At a timing (time t1) when the clock signal CLKIN changes from an "L" level to an "H" level, both the signals F1 and F2 are already at an "H" level. Accordingly, a delay control signal for increasing the delay time by one step relative to the delay control signal DELCNT(x−1), which was used for the (x−1)th comparison, serves as the delay control signal DCNT(x) in the x-th comparison period.

Since, in the x-th comparison period, the delay times of the delay circuits 70 to 72 are extended compared with in the (x−1)th comparison period, the cycle of the internal clock signal CLKCOMP becomes longer than in the (x−1)th comparison period. Accordingly, a timing tB corresponding to the (x−1)th tA approaches the timing (time t3) of the rising edge of the clock signal CLKIN. Therefore, although the timing of the rising edge of the signal F1 becomes earlier than the rising edge of the clock signal CLKIN, the timing of the rising edge of the signal F2 becomes later than the rising edge of the clock signal CLKIN. Accordingly, the value of the delay control signal DCNT is maintained as it is. At this time, the value of the delay control signal DCNT is the optimum value under the condition, and also hereinafter, the internal clock signal CLKCOMP is generated in the setting as it is.

FIGS. 13A to 13F are the time charts showing other delay control action of the ADC 13. FIGS. 13A to 13F show a case where the delay control signal DCNT is controlled in a direction of reducing the delay time and the relationship between the signal CLKIN and the signal F1 to thereby transition to the region where the current state is maintained. In FIGS. 13A to 13F, in the (x−1)th comparison period, a change from an "L" level to an "H" level of the signal VALID has occurred only seven times. Accordingly, the signals F1 and F2 remain at an "L" level and do not change.

At a timing (time t1) when the clock signal CLKIN changes from an "L" level to an "H" level, since both the signals F1 and F2 remain at an "L" level, a delay control signal for reducing the delay time by one step relative to the delay control signal DELCNT (x−1), which was used for the (x−1)th comparison, serves as the delay control signal DCNT(x) in the x-th comparison period.

Since, in the x-th comparison period, the delay times of the delay circuits 70 to 72 are shortened compared with in the time (x−1) comparison period, the cycle of the internal clock signal CLKCOMP becomes shorter than in the (x−1)th comparison period. Accordingly, a change from an "L" level to an "H" level of the signal F1, which did not occur at the (x−1)th comparison, will occur at a timing designated by tB during the x-th comparison period. Therefore, the timing of the rising edge of the signal F1 becomes earlier than the rising edge of the clock signal CLKIN, but the timing of the rising edge of the signal F2 becomes later than the rising edge of the clock signal CLKIN. Accordingly, the value of the delay control signal DCNT is maintained as it is. At this time, the value of the delay control signal DCNT is the optimum value under the condition, and also hereinafter, the internal clock signal CLKCOMP is generated in the setting as it is.

Meanwhile, when a determination of maintaining current state is made in the delay control process, the value of the delay control signal DCNT does not change. However, the delay control process is performed also hereinafter every time the clock signal CLKIN transitions from in the comparison period to in the sampling period, that is, every time the clock signal CLKIN switches from an "L" level to an "H" level, and does not stop.

Accordingly, for example, if the power supply voltage and temperature change in the middle of continuously performing the A/D conversion operation and thus the delay time of the delay circuits 70 to 72 fluctuate and deviates from the region determined as the region where the current state is maintained, then the delay time is controlled to increase or decrease again, and the semiconductor device behaves so that a delay time as optimum as possible is maintained within the control range of the delay control signal DCNT.

Figure 14A:
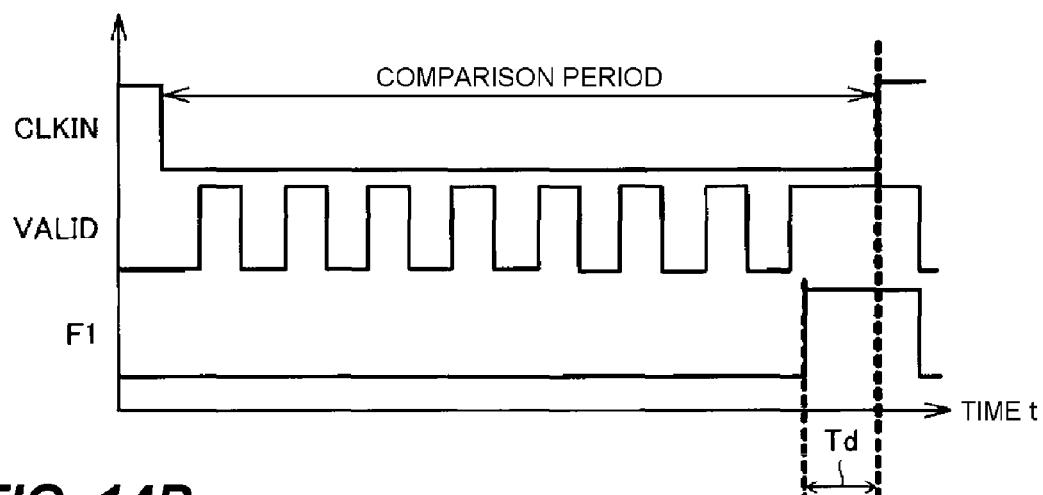
FIGS. 14A and 14B are the time charts for illustrating the limit of delay control of the ADC shown in FIG. 1 to FIG. 4.
Figure 14B:
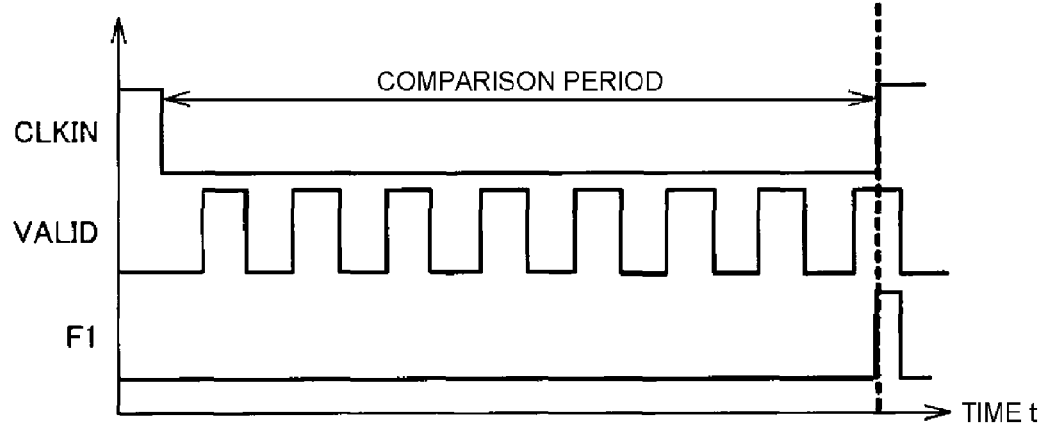

Moreover, FIGS. 14A and 14B are the time charts for explaining the limit of delay control in the first embodiment. As shown FIGS. 14A and 14B, both a case where the time Ta from the rising edge of the signal F1 to the rising edge of the clock signal CLKIN is substantially equal to the delay time Td and a case where the time Ta is substantially 0 are determined as the region where the current state is maintained. Accordingly, the limit of delay control depends on the delay time Td of the delay circuit 30.

Here, if a total change amount of the delay time in the case where the value of the delay control signal DCNT is changed by one step is set to ΔDA, the value of Td can be reduced as long as Td>ΔDA holds. Accordingly, in the first embodiment, the accuracy of delay control can be increased by setting the delay time Td of the delay circuit 30 to be shorter.

Figure 15A:
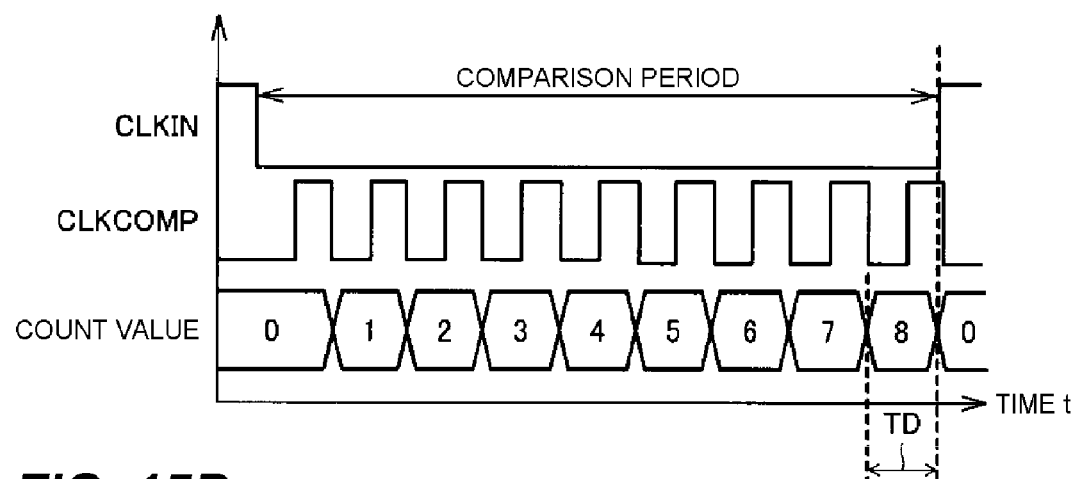
FIGS. 15A and 15B are the time charts for illustrating the limit of delay control in a comparative example of the first embodiment.
Figure 15B:
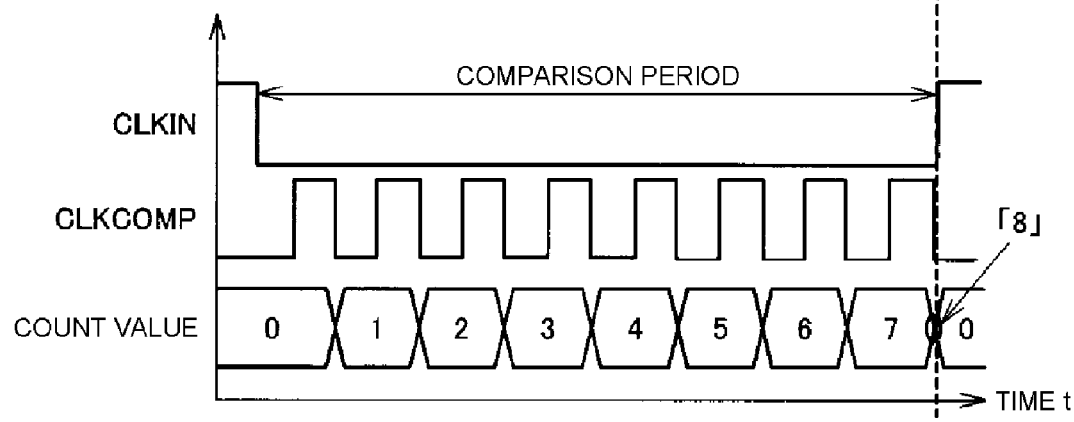

In contrast to this, FIGS. 15A and 15B are the time charts showing the limit of delay control in a comparative example of the first embodiment. In this comparative example, the number of falling edges of the internal clock signal CLKCOMP is counted with a counter (not shown), and a case where the count value is, for example, "8" is determined as the region where the current state is maintained.

As shown in FIGS. 15A and 15B, both a case where the ninth falling edge of the internal clock signal CLKCOMP is located immediately after the rising edge of the clock signal CLKIN and a case where the eighth falling edge of the internal clock signal CLKCOMP is located immediately before the rising edge of the clock signal CLKIN are determines as the region where the current state is maintained. Accordingly, the time TD of the limit of delay control in the comparative example is fixed to ⅛ of the comparison period and thus the accuracy of delay control cannot be increased. Therefore, the accuracy of delay control in the first embodiment is higher than the accuracy of delay control in the comparative example.

In the first embodiment, the delay control circuit 26 is in a halt state other than when the signals F1 and F2 change, when the rising edge of the clock signal CLKIN is input to the timing detection circuit 32, and when the value of the delay control signal DCNT is updated. Accordingly, because the delay control circuit 26 is halted in most periods throughout the sampling period and the comparison period, the delay control circuit 26 does not significantly increase the average power during the A/D conversion operation.

In addition, since the output signal SB[0] (=F1) of the sequence register 44 is used also as the means for delay control, the number of circuits that has to be added to realize the automatic control of delay time can be reduced as compared with the conventional example.

[Second Embodiment]

Figure 16:
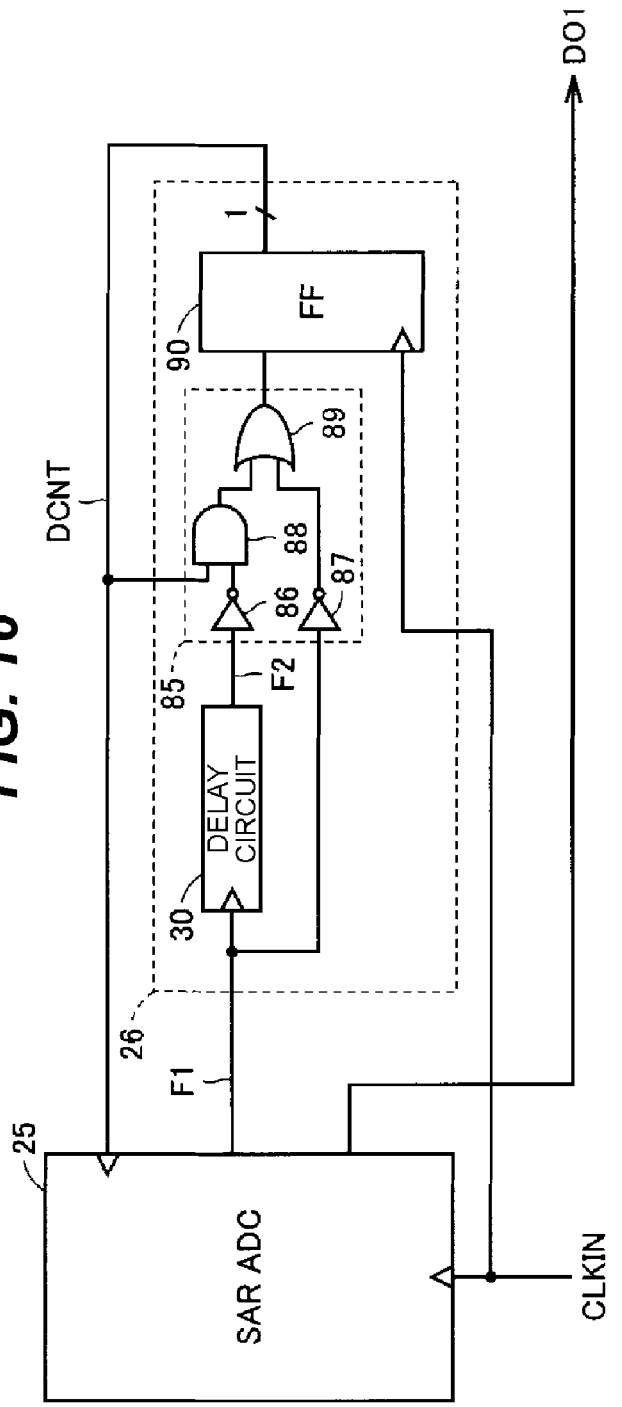
FIG. 16 is a circuit block diagram showing the configuration of an ADC according to a second embodiment of the present application.

FIG. 16 is a circuit block diagram showing the configuration of an ADC according to a second embodiment of the present application, and is the diagram to be compared with FIG. 3. In FIG. 16, in this ADC, the adder/subtraction circuit 31 is constituted of a combinational logic circuit 85, and the timing detection circuit 32 is constituted of a flip-flop 90. The combinational logic circuit 85 includes inverters 86 and 87, an AND gate 88, and an OR gate 89.

The delay control signal DCNT is a one-bit signal, and is supplied to the asynchronous successive approximation type ADC 25 and one input node of the AND gate 88. The output signal F2 of the delay circuit 30 is inverted by the inverter 86 and supplied to the other input node of the AND gate 88. The output signal of the AND gate 88 is supplied to one input node of the OR gate 89. The signal F1 is inverted by the inverter 87 and supplied to the other input node of the OR gate 89. The output signal of the OR gate 89 is supplied to the data input terminal of the flip-flop 90. The clock signal CLKIN is supplied to the clock terminal of the flip-flop 90. The output signal of the flip-flop 90 serves as the delay control signal DCNT.

When the signal F1 remains at an "L" level at a timing when the clock signal CLKIN changes from an "L" level to an "H" level, the output signal of the OR gate 89 becomes an "H" level because the output signal of the inverter 87 remains at an "H" level. Accordingly, the signal of an "H" level is captured by the flip-flop 90, and the delay control signal DCNT is switched to an "H" level by the next comparison period.

When the signals F1 and F2 are at an "H" level and an "L" level, respectively, at a timing when the clock signal CLKIN changes from an "L" level to an "H" level, the output signals of the inverters 86 and 87 become an "H" level and an "L" level, respectively. In this case, since the delay control signal DCNT is input to the data input terminal of the flip-flop 90 through the AND gate 88 and the OR gate 89, the current state is maintained.

When both the signals F1 and F2 are at an "H" level at a timing when the clock signal CLKIN changes from an "L" level to an "H" level, the output signals of the inverters 86 and 87 become an "L" level. Accordingly, the signal of an "L" level is taken in by the flip-flop 90, and the delay control signal DCNT is switched to an "L" level by the next comparison period. Since other configurations and operations are the same as the first embodiment, the description thereof is not repeated.

Also in the second embodiment, the same effect as the first embodiment is obtained. However, in the second embodiment, since the delay control signal DCNT has one bit, only two types of controls of reducing the delay time Td and extending the delay time Td, can be performed. Accordingly, the cycle of the internal clock signal CLKCOMP cannot be maintained at the optimum value.

However, if the change amount of the delay time that varies by switching of logic levels of the delay control signal DCNT is designed sufficiently large, both the following problems can be resolved: a problem in which the cycle of the internal clock signal CLKCOMP becomes too large to be able to perform a desired number of times of comparison; and a problem in which the cycle of the internal clock signal CLKCOMP becomes too small for the successive approximation to be able to follow the internal clock signal CLKCOMP.

[Third Embodiment]

Figure 17:
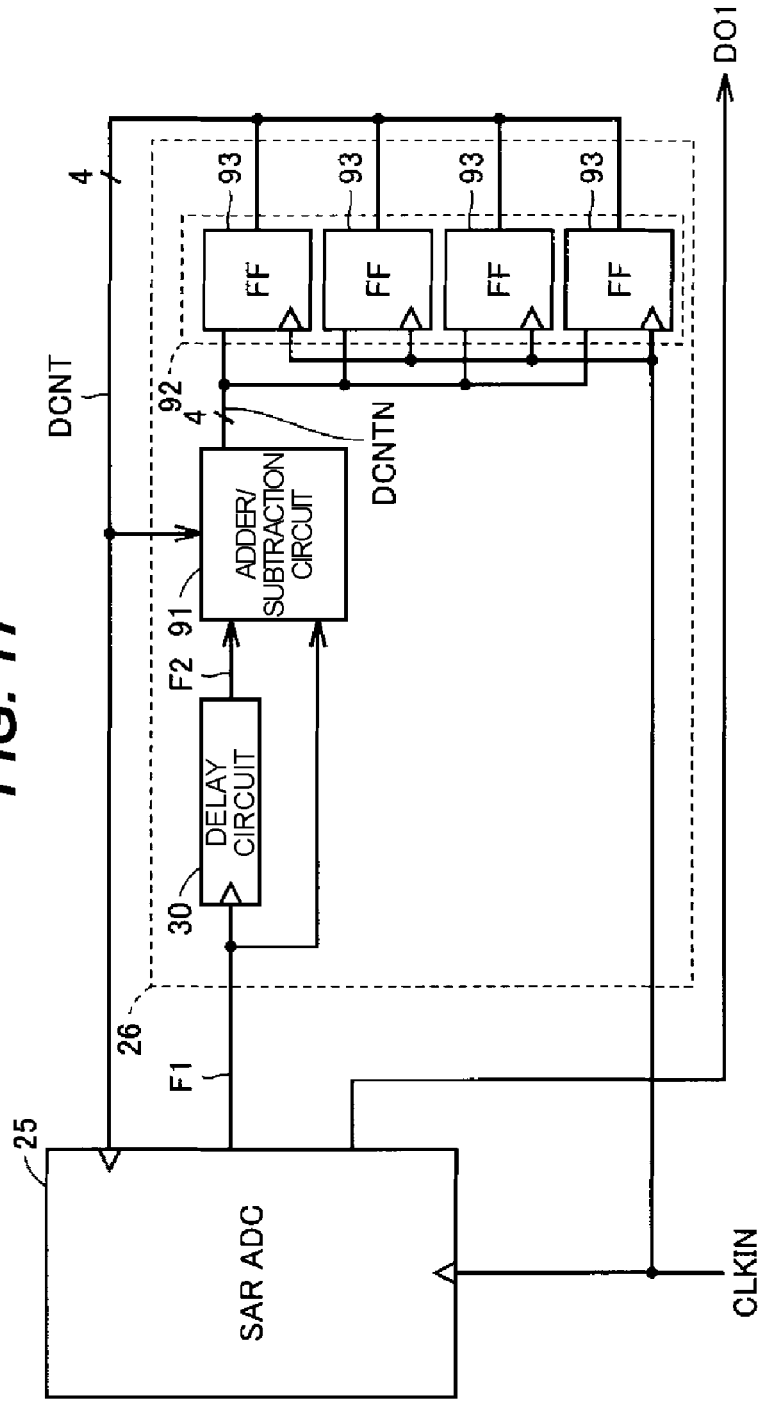
FIG. 17 is a circuit block diagram showing the configuration of an ADC according to a third embodiment of the present application.

FIG. 17 is a circuit block diagram showing the configuration of an ADC according to a third embodiment of the present application, and is the diagram to be compared with FIG. 3. In FIG. 17, this ADC differs from the ADC 13 of FIG. 3 in that the adder/subtraction circuit 31 and the timing detection circuit 32 are replaced with an adder/subtraction circuit 91 and a timing detection circuit 92, respectively. The bit width of the delay control signal DCNT is 4 bits.

The adder/subtraction circuit 91 generates the delay control signal DCNTN used in the next comparison period, on the basis of the delay control signal DCNT, which was determined in the previous comparison period, and the logic levels of the signals F1 and F2. Here, each of the delay control signals DCNT and DCNTN is a thermometer code.

The thermometer code is a code which is expressed by a bit sequence of binary notation and which sequentially changes from 0 to 1 in order from the minimum bit every time the numerical value increases. For example, the thermometer code is expressed as 0000, 0001, 0011, 0111, and 1111 in order from the smallest numerical value.

Accordingly, in the case where the delay control signal DCNT is 0011, when both the signals F1 and F2 are at an "L" level, the delay control signal DCNTN becomes 0111. Furthermore, in this case, when the signals F1 and F2 are at an "H" level and an "L" level, respectively, the delay control signal DCNTN becomes 0011, whereas when both the signals F1 and F2 are at an "H" level, the delay control signal DCNTN becomes 0001.

In addition, as a special example, in the case where the delay control signal DCNT is 1111, when both the signals F1 and F2 are at an "L" level, the delay control signal DCNTN becomes 1111. Furthermore, in the case where the delay control signal DCNT is 0000, when both the signals F1 and F2 are at an "H" level, the delay control signal DCNTN becomes 0000.

The timing detection circuit 92 includes four flip-flops 93, and takes in, at a timing when the clock signal CLKIN changes from an "L" level to an "H" level, the delay control signal DCNTN from the adder/subtraction circuit 91 and outputs the delay control signal DCNT for the next comparison period. Accordingly, the delay times of the delay circuits 70 to 72 are modified by the next comparison period.

Meanwhile, in the third embodiment, since the delay control signal DCNT is the thermometer code, the amount of adjustment of the delay time for each bit of the delay control signal DCNT needs to be the same. Accordingly, as the delay circuit 70 to be controlled, a circuit is used in which the weighting of the amount of adjustment for each bit is equal, for example as shown in FIG. 9.

In addition, in the third embodiment, since the bit width of the delay control signal DCNT is set to 4 bits, values which the delay control signal DCNT can take are five patterns of 1111, 0111, 0011, 0001, and 0000. Accordingly, five steps of adjustment are possible.

As long as the amount of delay adjustment $\Delta t$ per step of the delay control signal DCNT satisfies the condition of Td>$\Delta t$ for the delay time Td of the delay circuit 30, if the number of flip-flops 93 of the timing detection circuit 91 is set to M and the configuration of the adder/subtraction circuit 91 is expanded accordingly, adjustment of (M+1) steps is possible and the delay times of the delay circuits 70 to 72 can be accurately optimized.

The advantages of employing the delay control signal DCNT of the thermometer scheme include simplicity of the configuration of the adder/subtraction circuit 91. For example, in the case where the delay control signal DCNT becomes 0011 as a result of performing an arbitrary number of times of automatic delay time adjustment, the next candidates are three of 0111, 0011, and 0001. Here, by the comparison of the candidates with the original code (0011), it can be seen that only a bit before and after switching of 0 and 1 of the original code changes. That is, in the case of using the thermometer format, the next switching bit can be specified with a simple method for detecting a switching point between 0 and 1 by using an EX-OR gate, for example, and inputting arbitrary continuous two bits to the EX-OR gate.

[Fourth Embodiment]

Figure 18:
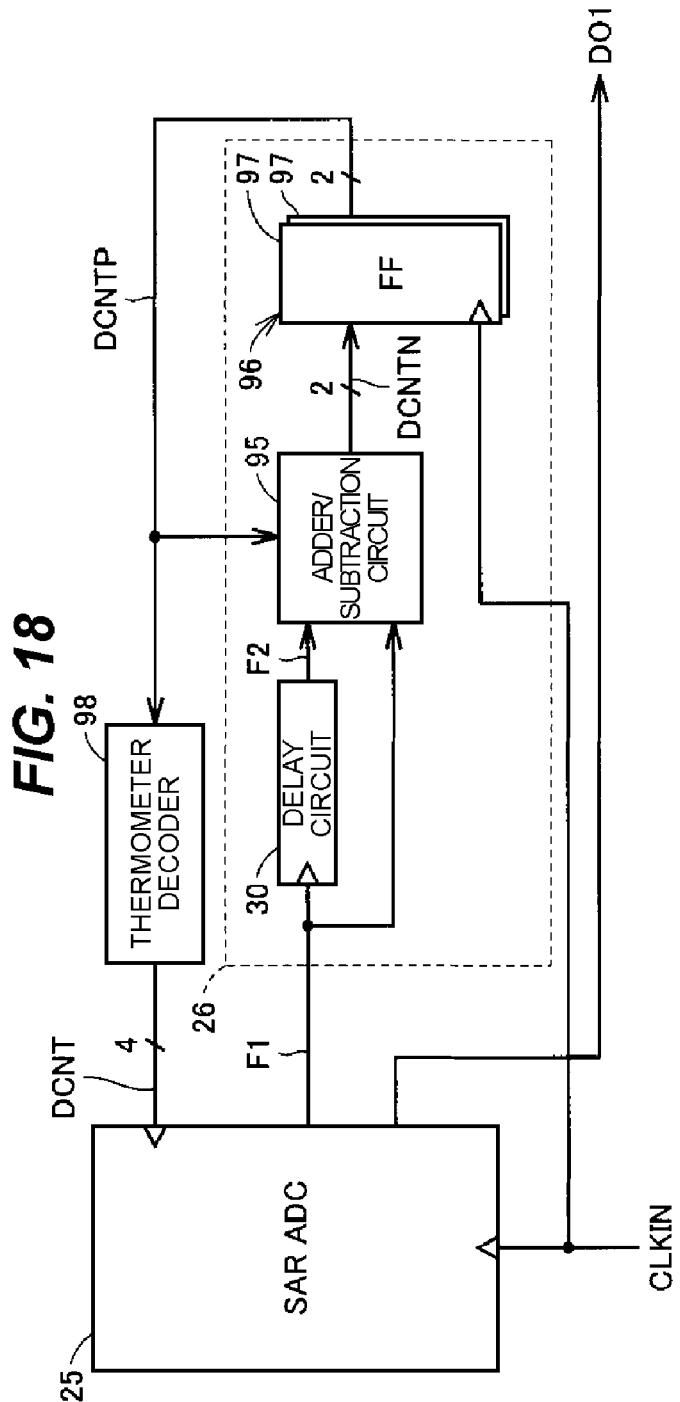
FIG. 18 is a circuit block diagram showing the configuration of an ADC according to a fourth embodiment of the present application.

FIG. 18 is a circuit block diagram showing the configuration of an ADC according to a fourth embodiment of the present application, and is the diagram to be compared with FIG. 17. In FIG. 18, this ADC differs from the ADC of FIG. 17 in that the adder/subtraction circuit 91 and the timing detection circuit 92 are replaced with an adder/subtraction circuit 95 and a timing detection circuit 96, respectively, and that a thermometer decoder 98 is added. The bit width of each of the delay control signals DCNTN and the DCNTP is 2 bits. The bit width of the delay control signal DCNT is 4 bits.

The adder/subtraction circuit 95 generates the delay control signal DCNTN used in the next comparison period, on the basis of the delay control signal DCNTP which was determined in the previous comparison period and the logic levels of the signals F1 and F2. Here, each of the delay control signals DCNTN and DCNTP is a binary code.

For example, in the case where the delay control signal DCNTP is "01", when both the signals F1 and F2 are at an "L" level, the delay control signal DCNTN becomes "10". When the signals F1 and F2 are at an "H" level and an "L" level, respectively, the delay control signal DCNTN is maintained at "01". When both the signals F1 and F2 are at an "H" level, the delay control signal DCNTN becomes "00".

Moreover, as a special example, in the case where the delay control signal DCNTP is "11", when both the signals F1 and F2 are at an "L" level, the delay control signal DCNTN becomes "11". Moreover, in the case where the delay control signal DCNTP is "00", when both the signals F1 and F2 are at an "H" level, the delay control signal DCNTN becomes "00".

FIG. 19 is a circuit block diagram showing the configuration of the adder/subtraction circuit 95. In FIG. 19, the adder/subtraction circuit 95 includes an AND gate 100, an EX-NOR gate 101, adder circuits 102 and 103, and an OF/UF (Overflow/Underflow) determination circuit 104.

The AND gate 100 receives the signals F1 and F2 and outputs a signal AC1. The EX-NOR gate 101 receives the signals F1 and F2 and outputs a signal AC0. Three input terminals (A, B, C) of the adder circuit 102 receive a delay control signal DCNTP[1], the output signal AC1 of the AND gate 100, and a carry signal of the adder circuit 103, respectively. Three input terminals (A, B, C) of the adder circuit 103 receive a delay control signal DCNTP[0], the output signal AC0 of the EX-NOR gate 101, and a signal of an "L" level, respectively.

Each of the adder circuits 102 and 103 outputs an addition result of the signals supplied to the three input terminals (A, B, C), to a terminal S, and outputs a carry signal to a terminal CY. The OF/UF determination circuit 104 is a circuit for performing special processing in the case where addition processing has been performed with respect to the signal DCNTP="11" and special processing in the case where subtraction processing has been performed with respect to the signal DCNTP="00".

FIG. 20 is a diagram showing a relationship between the signals F1 and F2 and the signals AC1 and AC0. In FIG. 20, when the signals F1 and F2 are "00", the signals AC1 and AC0 become "01" and the value of the delay control signal DCNTN is increased. When the signals F1 and F2 are "10", the signals AC1 and AC0 become "00" and the value of the delay control signal DCNTN is maintained. When the signals F1 and F2 are "11", the signals AC1 and AC0 become "11" and the value of the delay control signal DCNTN is reduced.

Returning to FIG. 18, the timing detection circuit 96 includes two flip-flops 97, and takes in, at a timing when the clock signal CLKIN changes from an "L" level to an "H" level, the delay control signal DCNTN from the adder/subtraction circuit 95 and outputs the delay control signal DCNTP for the next comparison period.

The thermometer decoder 98 converts the delay control signal DCNTP of 2 bits of the binary format from the timing detection circuit 96 to the delay control signal DCNT of 4 bits of the thermometer format. In accordance with the setting value of this delay control signal DCNT, the setting of the delay time of the delay circuits 70 to 72 switches by the next comparison period.

Meanwhile, also in the fourth embodiment, as with the third embodiment, the delay control signal DCNT is the thermometer code, and thus as the delay circuits 70 to 72 to be adjusted, a circuit is used in which the weighting of the amount of adjustment for each bit is equal as shown in, for example, FIG. 9.

Also in the fourth embodiment, the bit width of the delay control signal DCNT is set to 4 bits, and thus a value which the delay control signal DCNT can take is any of five patterns of 1111, 0111, 0011, 0001, and 0000. Accordingly, five steps of adjustment are possible.

In the fourth embodiment, even if the bit width of the delay control signal DCNT is extended to N bits, the number of flip-flops 97 constituting the timing detection circuit 96 is suppressed to K ($2^{(K-1)}<N\leq 2^K$). Instead, the thermometer decoder 98 for converting K bits to N bits is required, but a total number of gates of the thermometer decoder 98 is smaller than the total number (N−K) of gates of the flip-flop 97. Accordingly, the circuit area of the ADC of the fourth embodiment becomes smaller than the circuit area of the ADC of the third embodiment.

[Fifth Embodiment]

Figure 21:
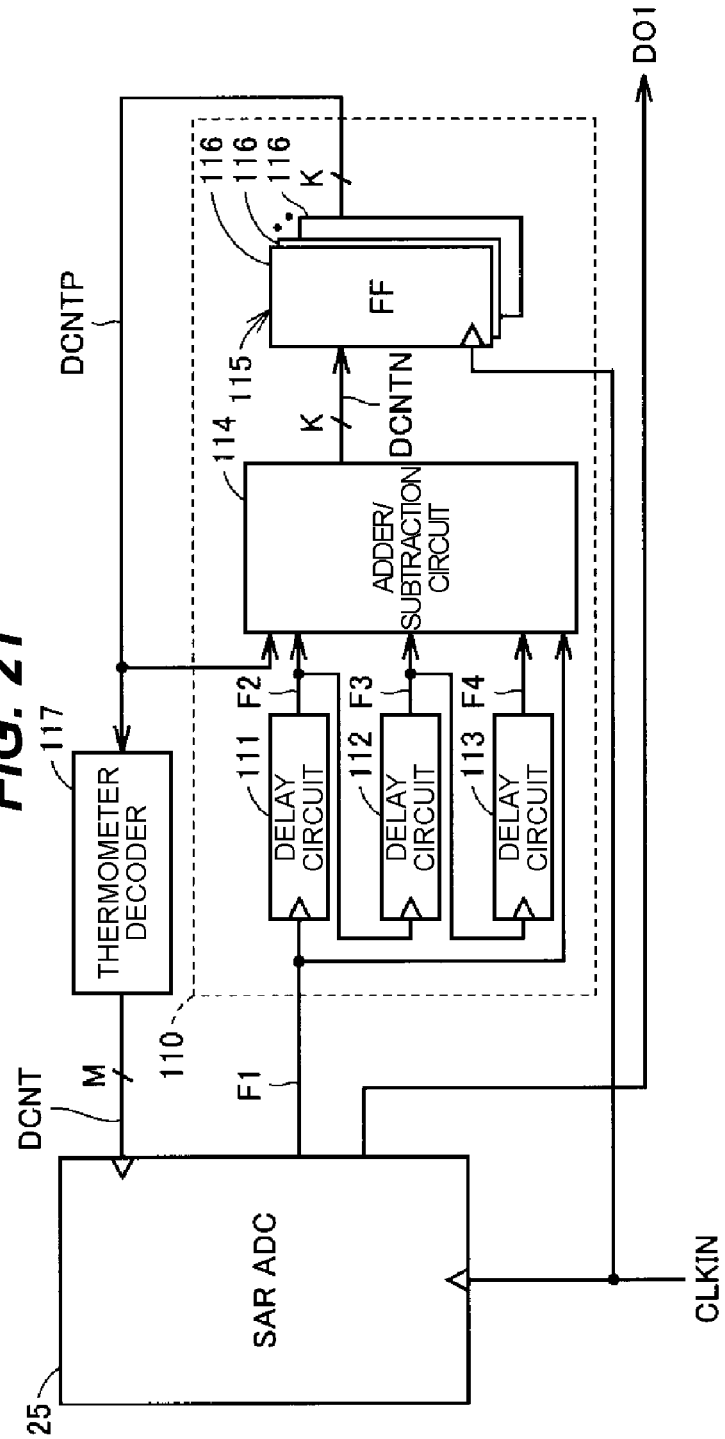
FIG. 21 is a circuit block diagram showing the configuration of an ADC according to a fifth embodiment of the present application.

FIG. 21 is a circuit block diagram showing the configuration of an ADC according to a fifth embodiment of the present application, and is the diagram to be compared with FIG. 18. In FIG. 21, this ADC includes the asynchronous successive approximation type ADC 25, a delay control circuit 110, and a thermometer decoder 117. In this ADC, the value of the delay control signal DCNT can be modified in a plurality of steps at once. Here, as one example, there is shown an ADC capable of increasing the value of the delay control signal DCNT by four steps at the maximum at once.

The delay control circuit 110 generate the delay control signal DCNTP of k bits of the binary format on the basis of the signal F1. The thermometer decoder 117 converts the delay control signal DCNTP of k bits of the binary format from the delay control circuit 110, to the delay control signal DCNT of M bits of the thermometer format, and supplies the resulting signal to the asynchronous successive approximation type ADC 25.

The delay control circuit 110 includes delay circuits 111 to 113, an adder/subtraction circuit 114, and a timing detection circuit 115. The delay circuit 111 delays the signal F1 and outputs the signal F2. The delay circuit 112 delays the signal F2 and outputs a signal F3. The delay circuit 113 delays the signal F3 and outputs a signal F4. The adder/subtraction circuit 114 generates the delay control signal DCNTN of K bits by using the delay control signal DCNTP and the signals F1 to F4.

FIG. 22 shows a truth table showing a relationship between the signals F1 to F4 and the delay times of the delay circuits 70 to 72. In FIG. 22, when the signals F1 to F4 are 0000, the delay time is reduced. When the signals F1 to F4 are 1000, the delay time is maintained. When the signals F1 to F4 are 1100, the delay time is extended by one step. When the signals F1 to F4 are 1110, the delay time is extended by two steps. When the signals F1 to F4 are 1111, the delay time is extended by four steps.

The timing detection circuit 115 includes K flip-flops 116, and takes in, at a timing when the clock signal CLKIN changes from an "L" level to an "H" level, the delay control signal DCNTN from the adder/subtraction circuit 95 and outputs the delay control signal DCNTP for the next comparison period.

The thermometer decoder 107 converts the delay control signal DCNTP of K bits of the binary format from the timing detection circuit 115, to the delay control signal DCNT of N bits of the thermometer format. In accordance with the setting value of this delay control signal DCNT, the setting of the delay time of the delay circuits 70 to 72 switches by the time of the next comparison period.

Meanwhile, in the third and fourth embodiments, the delay control signal DCNT is assumed to be adjusted in a step-by-step manner for each comparison completion timing. However, in the case where the delay control signal DCNT has M bits, it takes M times the cycle of the clock signal CLKIN to change the delay setting from the maximum delay setting to the minimum delay setting or from the minimum delay setting to the maximum delay setting. The adjustment to change from the maximum delay setting to the minimum delay setting or from the minimum delay setting to the maximum delay setting is required mainly at the time of start-up of the asynchronous successive approximation type ADC 25. Accordingly, a time of M times the cycle of the clock signal CLKIN has to be secured as the startup time, resulting in having a significant restriction in practicality.

In the fifth embodiment, as shown in FIG. 22, the delay time can be extend by four steps at the maximum for each comparison completion timing. Accordingly, in the case where the setting of the delay control signal DCNT prior to startup is started with the condition that the delay time is the shortest, that is, with the condition that the cycle of the internal clock signal CLKCOMP is the shortest, the time that has to be secured as the startup time can be reduced to approximately M/4 times the cycle of the clock signal CLKIN.

Meanwhile, in the direction of reducing the delay time, that is, the direction of reducing the cycle of the internal clock signal CLKCOMP, the delay time can be changed only by one step each time the comparison is completed. Accordingly, the value of the output signal DCNTP of the timing detection circuit 105 at the time of startup is desirably set to a value for minimizing the delay time, that is, a value for minimizing the cycle of the internal clock signal CLKCOMP.

In addition, in the fifth embodiment, a case of using three delay circuits 111 to 113 has been described, but in a case of using j delay circuits, the delay time can be theoretically extended by $2^{(j-1)}$ steps at once. In this case, the time that has to be secured as the startup time can be reduced to approximately $M/[2^{(j-1)}]$ times thereof.

[Sixth Embodiment]

Figure 23:
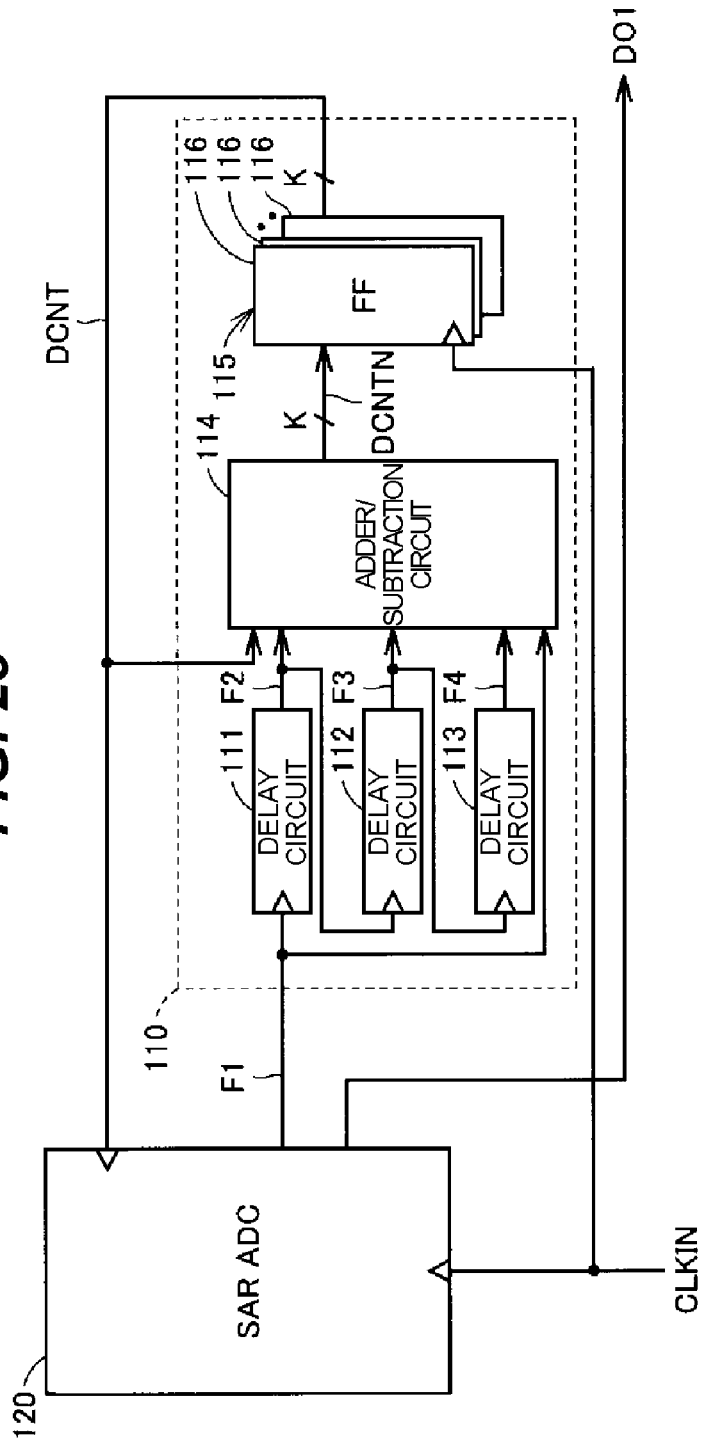
FIG. 23 is a circuit block diagram showing the configuration of an ADC according to a sixth embodiment of the present application.

FIG. 23 is a circuit block diagram showing the configuration of an ADC according to a sixth embodiment of the present application, and is the diagram to be compared with FIG. 21. In FIG. 23, this ADC differs from the ADC of FIG. 21 in that the thermometer decoder 117 is removed, that the output signal of the timing detection circuit 115 serves as the delay control signal DCNT, and that the asynchronous successive approximation type ADC 25 is replaced with an asynchronous successive approximation type ADC 120. The asynchronous successive approximation type ADC 120 is obtained by replacing each of the delay circuits 70 to 72 of the asynchronous successive approximation type ADC 25 with a delay circuit 121 shown in FIG. 24. However, in the delay circuit 121, K=3 holds.

In the delay circuit 121, the sizes (namely, current drive capabilities) of the transistors P4, P8, and P9 are the same and the sizes (namely, current drive capabilities) of Q4, Q5, Q6, and Q9 are the same. Moreover, the sizes (namely, current drive capabilities) of the transistors P5, P10 to P13 are the same, and the sizes (namely, current drive capabilities) of the transistors Q10 to Q14 are the same. The size of the transistor P6 is four times the size of the transistor P4, and the size of the transistor P7 is two times the size of the transistor P4. The size of the transistor Q7 is four times the size of the transistor Q4, and the size of the transistor Q8 is two times the size of the transistor Q4. The sizes of the transistors P1 to P3 are sufficiently large as compared with the transistors P4 to P13, and the sizes of the transistors Q1 to Q3 are sufficiently large as compared with the transistors Q4 to Q14. Each of the transistors P1 to P3 and Q1 to Q3 constitutes a switch, and the transistors P4 to P13 and Q4 to Q14 constitute a current mirror circuit.

Figure 24:
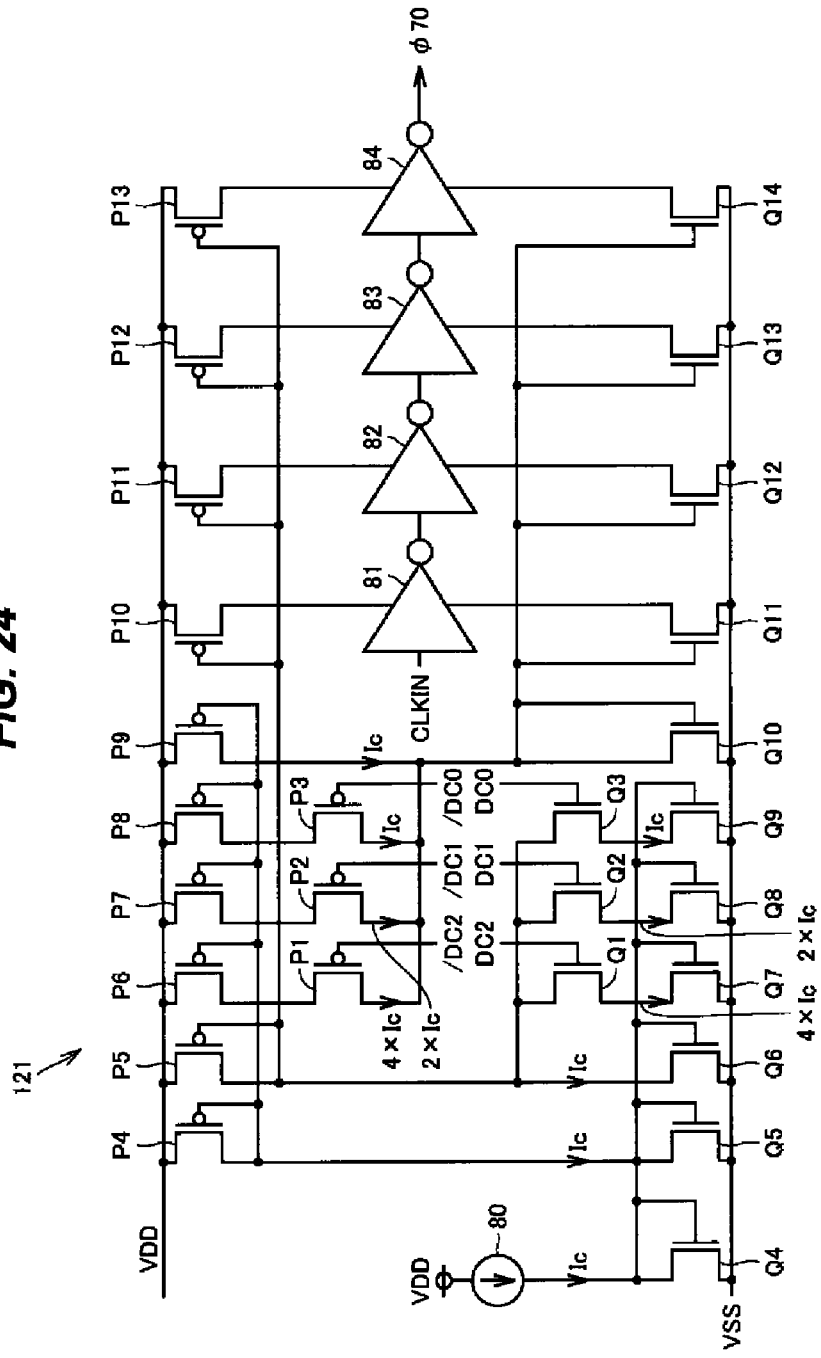
FIG. 24 is a circuit diagram showing the configuration of a delay circuit included in an internal clock generation circuit of the asynchronous successive approximation type ADC shown in FIG. 23.

In the sixth embodiment, the use of the delay circuit 121 including a delay time adjustment function having a different weighting for each bit as shown in FIG. 24 enables the adjustment of the delay time in a plurality of steps at once. When the power supply currents of the inverters 81 to 84 increase, the delay time of the inverters 81 to 84 decreases. For example, when the signals DC2 to DC0 are 000, all the transistors P1 to P3 and Q1 to Q3 become non-conductive. In this case, the current Ic flows through each of the transistors P10 to P13 and Q10 to Q13.

When the signals DC2 to DC0 are 001, the transistors P1, P2, Q1, and Q2 become non-conductive and the transistors P3 and Q3 are conducted to each other. In this case, a current 2×Ic flows through each of the transistors P10 to P13 and Q10 to Q13.

When the signals DC2 to DC0 are 010, the transistors P1, P3, Q1, and Q3 become non-conductive and the transistors P2 and Q2 are conducted to each other. In this case, a current 3×Ic flows through each of the transistors P10 to P13 and Q10 to Q13.

Hereinafter, similarly, when the signals DC2 to DC0 are 011, a current 4×Ic flows through each of the transistors P10 to P13 and Q10 to Q13. When the signals DC2 to DC0 are 100, a current 5×Ic flows through each of the transistors P10 to P13 and Q10 to Q13. When the signals DC2 to DC0 are 101, a current 6×Ic flows through each of the transistors P10 to P13 and Q10 to Q13. When the signals DC2 to DC0 are 110, a current 7×Ic flows through each of the transistors P10 to P13 and Q10 to Q13. When the signals DC2 to DC0 are 111, a current 8×Ic flows through each of the transistors P10 to P13 and Q10 to Q13. Accordingly, the delay time of the delay circuit 121 can be controlled by the data signals DC2 to DC0.

Meanwhile, in the fifth embodiment, the thermometer decoder 117 is required in order to convert the delay control signal DCNTP of K bits (where $2^{(K-1)} \leq N < 2^K$) to the delay control signal DCNT of N bits. This is because the weighting for each bit is equal in the delay circuits 70 to 72 inside the asynchronous successive approximation type ADC 25 to be controlled, as shown in FIG. 9.

In the sixth embodiment, since the delay circuit 121 having a different weighting for each bit is used as shown in FIG. 24, the thermometer decoder 117 is unnecessary.

Furthermore, in the delay circuit 121 as compared with the area of the thermometer decoder 117, the sizes of the transistors P6 and P7 are four times and the sizes of the transistors P7 and P8 are two times as compared with the delay circuit 70. However, since an increase of the area for that is sufficiently small, a reduction of the area as the entire circuit can be achieved.

[Seventh Embodiment]

Figure 25:
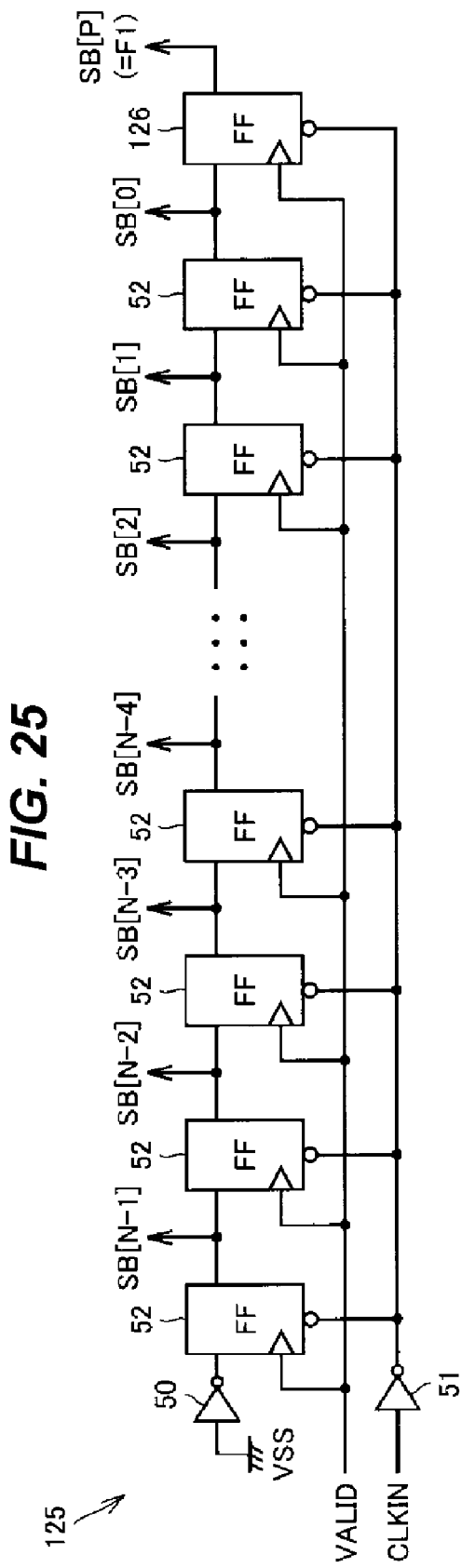
FIG. 25 is a circuit block diagram showing the configuration of a sequence register included in an ADC according to a seventh embodiment of the present application.

FIG. 25 is the circuit block diagram showing the configuration of a sequence register 125 included in an ADC according to a seventh embodiment of the present application, and is the diagram compared with FIG. 6. Referring to FIG. 25, this sequence register 125 differs from the sequence register 44 in that a preliminary flip-flop 126 is added. The output signal SB[0] of the flip-flop 52 of the final stage is input to the data input terminal of the flip-flop 126. The signal VALID is supplied to the clock terminal of the flip-flop 126, and the clock signal CLKIN is supplied to the reset terminal of the flip-flop 126. An output signal SB[P] of the flip-flop 126 is used as the signal F1 for detecting the completion of successive approximation. In this ADC, although the first to (N+1)th comparisons are performed, the (N+1)th comparison is a preliminary comparison, where an N-bit digital signal is generated.

In the seventh embodiment, provision of the preliminary flip-flop 126 in the sequence register 125 makes it possible to reliably obtain the internal clock signal CLKCOMP of a desired number of pulses. Meanwhile, while only one preliminary flip-flop 126 is provided in FIG. 25, a plurality of preliminary flip-flops may be provided as required.

In the first to sixth embodiments, if the change amount per cycle of the internal clock signal CLKCOMP when the delay time is adjusted by one step is denoted by Δt, the change amount of the time required for the N-bit successive approximation operation is N×Δt. In the present application, because it is intended to adjust the delay time so that the rising edge of the signal F1 eventually falls within the region where the current state is maintained, shown in FIG. 11 by automatic adjustment, the design is made so that this N×Δt does not exceed the delay time Td generated by the delay circuit 30.

However, when the value of N×Δt is close to the value of Td, the magnitude relation therebetween may be reversed due to an unexpected factor. In this case, every time the comparison period is completed, the magnitude relation goes back and forth between the "delay time extension" region and the "delay time reduction" region shown in FIG. 11. A case where the delay time is erroneously adjusted to fall within the "delay time reduction" region is particularly a major problem. When, in a certain comparison period, the delay time in the next comparison period is adjusted toward the "delay time reduction", this implies that the desired number of times of clock pulses is not generated during the comparison period. Accordingly, the comparison result in this case has "(N−1)bit accuracy" at a maximum. Therefore, in the configurations of the first to sixth embodiments, if the magnitude relation goes back and forth for each comparison period between the "delay time extension" region and the "delay time reduction" region of FIG. 11, the comparison with a desired accuracy is no longer made once every two times.

Figure 26A:
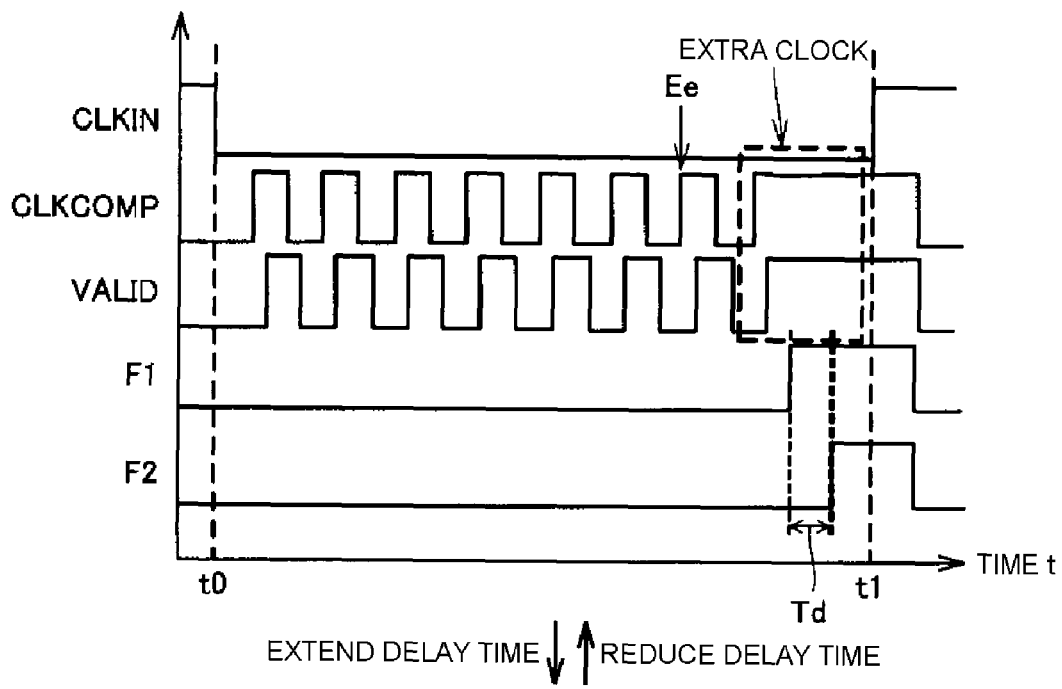
FIGS. 26A and 26B are the time charts showing the operation of the ADC including the sequence register shown in FIG. 25.
Figure 26B:
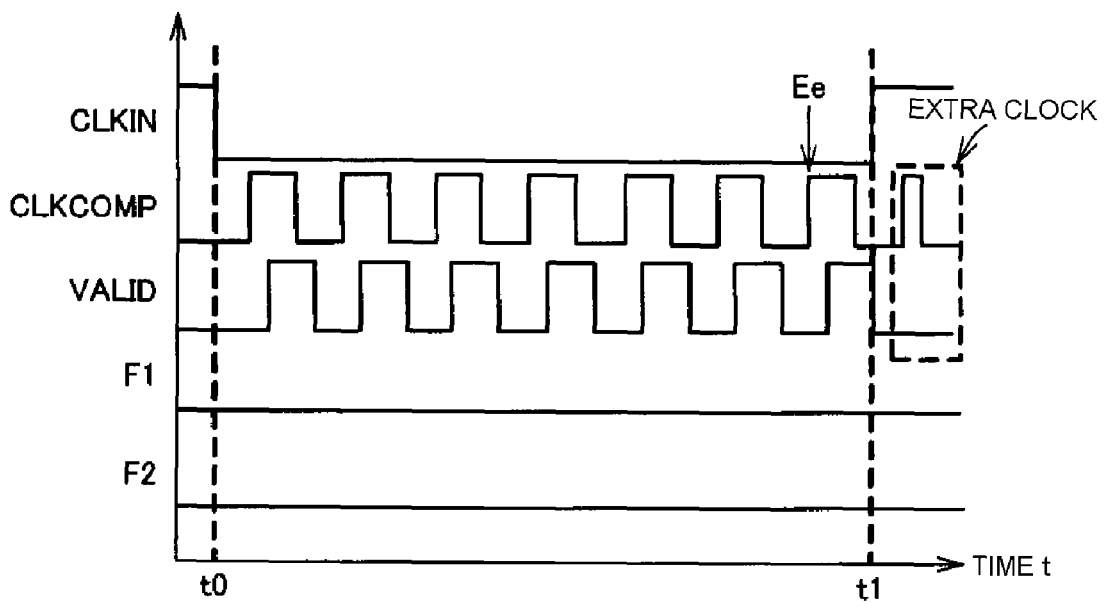

As a method for solving such a problem, the sequence register 125 shown in FIG. 25 is employed and the output signal SB[P] of the preliminary flip-flop 126 is used as the signal F1. Therefore, for example, even if the reversal of the relationship between (N+1)×Δt and Td occurs and the delay time extension and the delay time reduction are alternately performed at a cycle of the internal clock signal CLKCOMP, only the preliminary clock part (SB[P]) is generated or not generated as shown in FIGS. 26A and 26B and the signals B[N−1] to B[0] required for the comparison are reliably generated.

[Eighth Embodiment]

Figure 27:
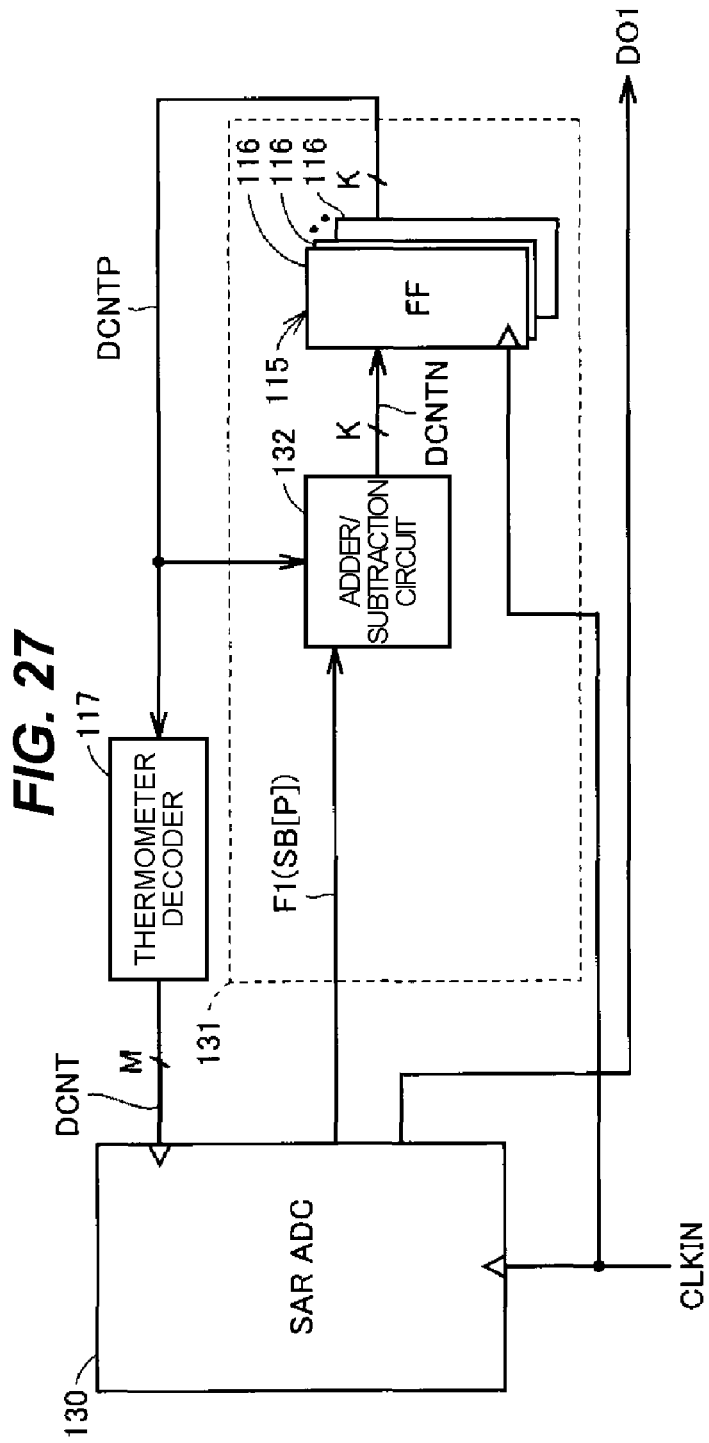
FIG. 27 is a circuit block diagram showing the configuration of an ADC according to an eighth embodiment of the present application.

FIG. 27 is a circuit block diagram showing the configuration of an ADC according to an eighth embodiment of the present application, and is the diagram to be compared with FIG. 21. Referring to FIG. 27, this ADC includes an asynchronous successive approximation type ADC 130, a delay control circuit 131, and the thermometer decoder 117. The delay control circuit 131 includes an adder/subtraction circuit 132 and a timing detection circuit 115. The asynchronous successive approximation type ADC 130 includes the sequence register 125 shown in FIG. 25, and outputs the signal SB[P] as the signal F1. The asynchronous successive approximation type ADC 130 performs the first to (N+1)th comparisons, in which the (N+1)th comparison is a preliminary comparison for generating an N-bit digital signal. The delay control circuit 131 does not need the delay circuits 111 to 113 shown in FIG. 21.

Figure 28:
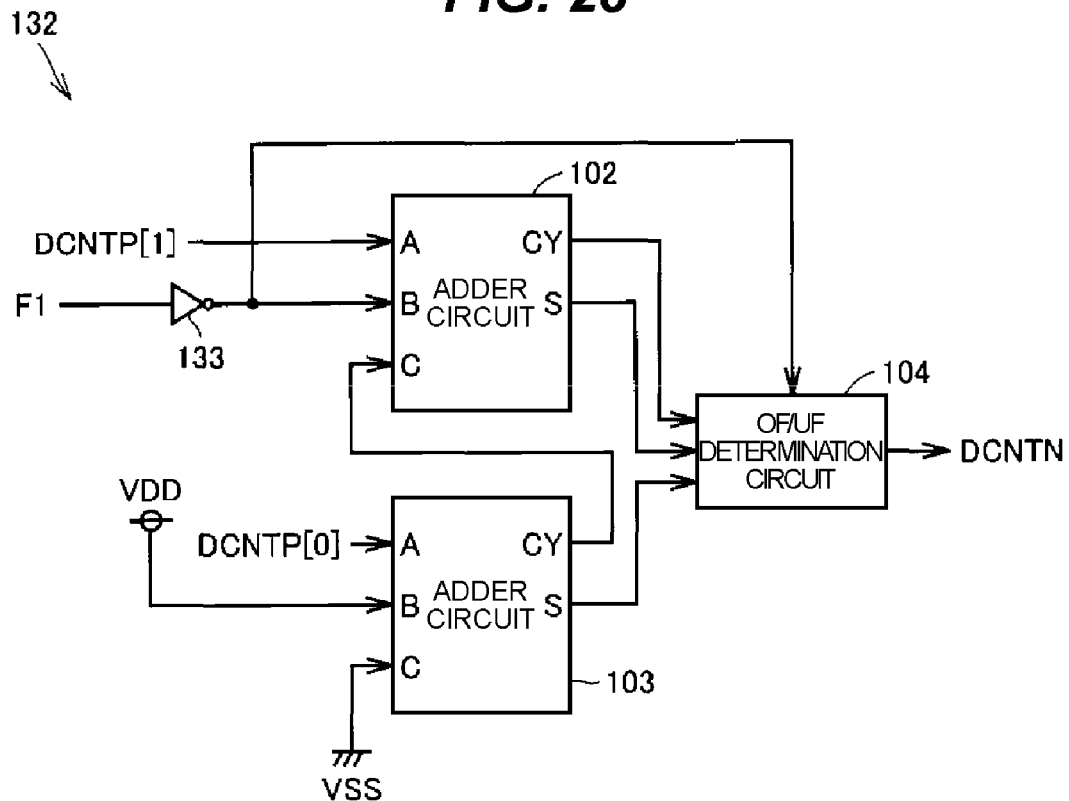
FIG. 28 is a circuit block diagram showing the configuration of an adder/subtraction circuit shown in FIG. 27.

FIG. 28 is the circuit block diagram showing the configuration of the adder/subtraction circuit 132, and is the diagram compared with FIG. 19. However, for simplicity of illustration and description, K=2 is set. Referring to FIG. 28, the adder/subtraction circuit 132 is obtained by replacing the AND gate 100 and EX-NOR gate 101 of the adder/subtraction circuit 95 with an inverter 133. The signal F1 is inverted by the inverter 133 and supplied to the input terminal (B) of the adder circuit 102 and the OF/UF determination circuit 104.

When the signal F1 is at an "H" level ("1"), the adder/subtraction circuit 132 generates the delay control signal DCNTN having the value larger by one step than the previous value of the delay control signal DCNTP, whereas when the signal F1 is at an "L" level ("0"), the adder/subtraction circuit 132 generates the delay control signal DCNTN having the value smaller by one step than the previous value of the delay control signal DCNTP. The functions of the timing detection circuit 115 and thermometer decoder 117 are as described using FIG. 21.

Figure 29:
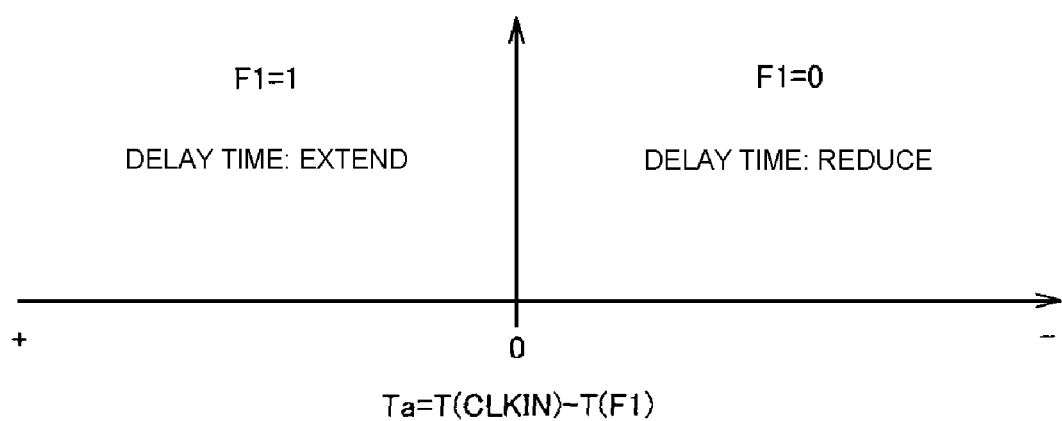
FIG. 29 is a view showing the operation of a delay control circuit shown in FIG. 27.

FIG. 29 is a diagram showing a relationship between the timings of the rising edge of the clock signal CLKIN and the signal F1 and the delay times of the delay circuits 70 to 72. The horizontal axis of FIG. 29 represents the time difference Ta=T(CLKIN)−T(F1) between the rising edge of the clock signal CLKIN and the rising edge of the signal F1.

In the case of Ta>0, since the timing of the completion of successive approximation is early, the delay times of the delay circuits 70 to 72 are extended and thus the cycle of the internal clock signal CLKCOMP is lengthened. In the case of 0>Ta, since the timing of the completion of successive approximation is late, the delay times of the delay circuits 70 to 72 are reduced and thus the cycle of the internal clock signal CLKCOMP is shortened.

In the first to seventh embodiments, extension of the delay time, maintenance of the current state, or reduction of the delay time is determined on the basis of the signals F1 and F2 and the like, but in the eighth embodiment, only the extension or reduction of the delay time is determined on the basis of the signal F1. That is, in the eighth embodiment, by focusing on arbitrary two-consecutive comparison periods, the extension of the delay time and the reduction of the delay time are performed once, respectively.

In the seventh embodiment, assuming that Td<N×Δt holds and as a result of performing arbitrary number of times of delay control processes, a state is considered to be reached where the extension of the delay time and the reduction of the delay time are alternately performed at a cycle of the clock signal CLKIN, as shown in FIGS. 26A and 26B. At this time, when the characteristics do not vary depending on whether or not the signal F1 is generated, that is, in any case, if a series of operations from the sequence register 44 to the DAC 40 via the bit control register 45 of FIG. 4 can sufficiently follow the cycle of the internal clock signal CLKCOMP, a configuration without the region where the current state is maintained shown in FIG. 11 is also possible.

In the eighth embodiment, the circuit area can be reduced because there is no delay circuit inside the delay control circuit 131. In addition, the circuit area can be further reduced because the configuration of the adder/subtraction circuit 132 can also be simplified as compared with the other embodiments.

In the adder/subtraction circuit 132 of FIG. 28, because the AND gate 100 and EX-NOR gate 101 of FIG. 19 are unnecessary, the circuit area can be reduced smaller than the adder/subtraction circuit 95 of FIG. 19. The adder/subtraction circuit 132 of FIG. 28 is a configuration corresponding to the fourth embodiment, and cannot be simply compared with the adder/subtraction circuits of the other embodiments. However, the reduction of the circuit area by reducing the number of gates by not providing the region where the current state is maintained can be attained by any method. Furthermore, the larger the number of bits of the delay control signal DCNT is, that is, the more precise adjustment of the delay time is intended to be performed, the higher the area reduction effect becomes.

Meanwhile, in the eighth embodiment, because the value of the delay control signal DCNT is updated every time in accordance with the logic level of the signal F1 at a timing when the clock signal CLKIN switches from an "L" level to an "H" level, there is a limit of the detailed optimization of the cycle of the internal clock signal CLKCOMP.

The present invention made by the present inventor has been described specifically on the basis of the embodiments. However, it is needless to say that the present invention is not limited to the embodiments, but various modifications are possible without departing from the scope of the invention.

What is claimed is:

1. A semiconductor device comprising:
    an asynchronous successive approximation type A/D converter that samples an external analog signal in a sampling period, generates an internal clock signal in a comparison period, performs first to n-th comparisons in synchronization with first to n-th leading edges (where n is an integer equal to or greater than 2) of the internal clock signal, and converts the external analog signal to a multi-bit digital signal on the basis of a comparison result,
    wherein the asynchronous successive approximation type A/D converter includes a sequence register that outputs first to n-th signals indicating that the first to n-th comparisons have been performed, respectively,
    the semiconductor device further comprising a control circuit that detects whether or not the n-th signal is output when a period transitions from the comparison period to the sampling period, and that controls a cycle of the internal clock signal on the basis of a detection result.

2. The semiconductor device according to claim 1, further comprising a delay circuit that delays the n-th signal and generates an (n+1)th signal,
    wherein the control circuit detects whether or not the n-th and (n+1)th signals are output, respectively, when a period transitions from the comparison period to the sampling period, and controls a cycle of the internal clock signal on the basis of a detection result.

3. The semiconductor device according to claim 2,
    wherein the control circuit:
    reduces a cycle of the internal clock signal when both the n-th and (n+1)th signals are not output,
    increases the cycle of the internal clock signal when both the n-th and (n+1)th signals are output, and
    maintains the cycle of the internal clock signal when the first signal is output but the second signal is not output yet.

4. The semiconductor device according to claim 1, further comprising a plurality of delay circuits that is coupled in series and that delays the n-th signal,
    wherein the control circuit detects, when a period transitions from the comparison period to the sampling period, whether or not the n-th signal and an output signal of the delay circuits are output, respectively, and controls a cycle of the internal clock signal on the basis of a detection result.

5. The semiconductor device according to claim 1,
    wherein the control circuit:
    reduces a cycle of the internal clock signal when the n-th signal is not output yet, and
    increases a cycle of the internal clock signal when the n-th signal is output.

6. The semiconductor device according to claim 1,
    wherein the asynchronous successive approximation type A/D converter converts the external analog signal to an n-bit digital signal.

7. The semiconductor device according to claim 1,
    wherein the n-th comparison is a preliminary comparison, and
    wherein the asynchronous successive approximation type A/D converter converts the external analog signal to an (n−1)bit digital signal.

8. The semiconductor device according to claim 1,
    wherein the asynchronous successive approximation type A/D converter includes an internal clock generation circuit that includes a delay circuit capable of controlling a delay time, generates an internal clock signal of a cycle corresponding to the delay time in accordance with transition from the sampling period to the comparison period, and stops generation of the internal clock signal in response to the n-th signal, and wherein the control circuit controls a delay time of the delay circuit to thereby control a cycle of the internal clock signal.

9. The semiconductor device according to claim 8,
wherein the control circuit generates a delay control signal of a thermometer format for controlling the delay time, and
wherein the delay time varies depending on the delay control signal of the thermometer format.

10. The semiconductor device according to claim 8,
wherein the control circuit generates a delay control signal of a binary format for controlling the delay time, and
wherein the delay time varies depending on a delay control signal of the binary format.

11. The semiconductor device according to claim 10,
wherein a change amount of the delay time differs for each bit of the delay control signal of the binary format.

12. The semiconductor device according to claim 8,
wherein the control circuit generates a delay control signal of a binary format for controlling the delay time, and further includes a decoder that converts the delay control signal of the binary format to a delay control signal of a thermometer format, and
wherein the delay time varies depending on the delay control signal of the thermometer format.

13. The semiconductor device according to claim 1,
wherein the sampling period is a period during which the external clock signal is at a first logic level, and
wherein the comparison period is a period during which the external clock signal is at a second logic level.

14. The semiconductor device according to claim 1, wherein the multi-bit digital signal is different from the first to n-th signals.

15. The semiconductor device according to claim 1, wherein the sequence register outputs the multi-bit digital signal and the first to n-th signals.

16. The semiconductor device according to claim 1, further comprising a delay circuit that outputs a delayed n-th signal, the control circuit controls the cycle of the internal clock according to values of the n-th signal and the delayed n-th signal.

17. The semiconductor device according to claim 16, in response to the value of the delayed n-th signal being different from the value of the n-th signal, the control circuit changes the cycle of the internal clock.

18. The semiconductor device according to claim 16, in response to the value of the delayed n-th signal matching the value of the n-th signal, the control circuit maintains the cycle of the internal clock.

19. A device comprising:
an asynchronous successive approximation type A/D converter configured to sample an analog signal in a sampling period, generate a clock signal in a comparison period, perform first to n-th comparisons in synchronization with first to n-th edges (where n is an integer equal to or greater than 2) of the clock signal, and convert the analog signal to a multi-bit digital signal on the basis of a comparison result,
a sequence register configured to output first to n-th signals indicating that the first to n-th comparisons have been performed, respectively,
a delay circuit configured to output a delayed n-th signal;
a control circuit configured to control the cycle of the clock according to values of the n-th signal and the delayed n-th signal.

20. The device according to claim 19, wherein in response to the value of the delayed n-th signal being different from the value of the n-th signal, the control circuit changes the cycle of the clock, and in response to the value of the delayed n-th signal matching the value of the n-th signal, the control circuit maintains the cycle of the internal clock.

* * * * *